(12) United States Patent
Tsai et al.

(10) Patent No.: US 12,424,537 B2
(45) Date of Patent: *Sep. 23, 2025

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Yao-Jen Tsai, Kaohsiung (TW); Chih-Fu Chang, Pingtung (TW); Sheng Chiang Hung, Hsinchu (TW); Chin-Yuan Ko, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 223 days.

This patent is subject to a terminal disclaimer.

(21) Appl. No.: 17/583,789

(22) Filed: Jan. 25, 2022

(65) Prior Publication Data

US 2023/0035580 A1 Feb. 2, 2023

Related U.S. Application Data

(60) Provisional application No. 63/227,752, filed on Jul. 30, 2021.

(51) Int. Cl.
*H01L 23/522* (2006.01)
*H10D 1/00* (2025.01)
(Continued)

(52) U.S. Cl.
CPC ...... *H01L 23/5223* (2013.01); *H01L 23/5226* (2013.01); *H01L 23/5228* (2013.01);
(Continued)

(58) Field of Classification Search
CPC ............ H01L 23/5223; H01L 23/5226; H01L 23/5228; H10D 1/716; H10D 1/041; H10D 1/47
See application file for complete search history.

(56) References Cited

U.S. PATENT DOCUMENTS 9,806,032 B1 10/2017 Lin et al.
10,297,494 B2 5/2019 Yu et al.
(Continued)

FOREIGN PATENT DOCUMENTS

| CN | 110783320 A | 2/2020 |
| TW | 201841270 A | 11/2018 |
| TW | 201916301 A | 4/2019 |

*Primary Examiner* — Nathan W Ha
(74) *Attorney, Agent, or Firm* — NZ Carr Law Office

(57) ABSTRACT

An interconnect structure and methods of forming the same are described. In some embodiments, the structure includes a first intermetal dielectric (IMD) layer disposed over a plurality of conductive features and a first passive component disposed on the first IMD layer in a first region of the substrate. The structure further includes a second passive component disposed on the first IMD layer in a second region of the substrate. The second passive component includes a first conductive layer, and the first conductive layer has a first thickness. The structure further includes a second IMD layer disposed on the first passive component in the first region and on the second passive component and a portion of the first IMD layer in the second region. The second IMD layer has a second thickness ranging from about five times to about 20 times the first thickness.

20 Claims, 24 Drawing Sheets

(51) Int. Cl.
    *H10D 1/47*     (2025.01)
    *H10D 1/68*     (2025.01)
    *H10D 88/00*     (2025.01)

(52) U.S. Cl.
    CPC ............... *H10D 1/042* (2025.01); *H10D 1/47* (2025.01); *H10D 1/716* (2025.01); *H10D 88/00* (2025.01)

(56) References Cited

U.S. PATENT DOCUMENTS

| | | |
|---|---|---|
| 10,734,474 B2 | 8/2020 | Huang et al. |
| 10,741,488 B2 | 8/2020 | Chou |
| 11,799,001 B2 * | 10/2023 | Chen ................. H01L 29/41725 |

* cited by examiner

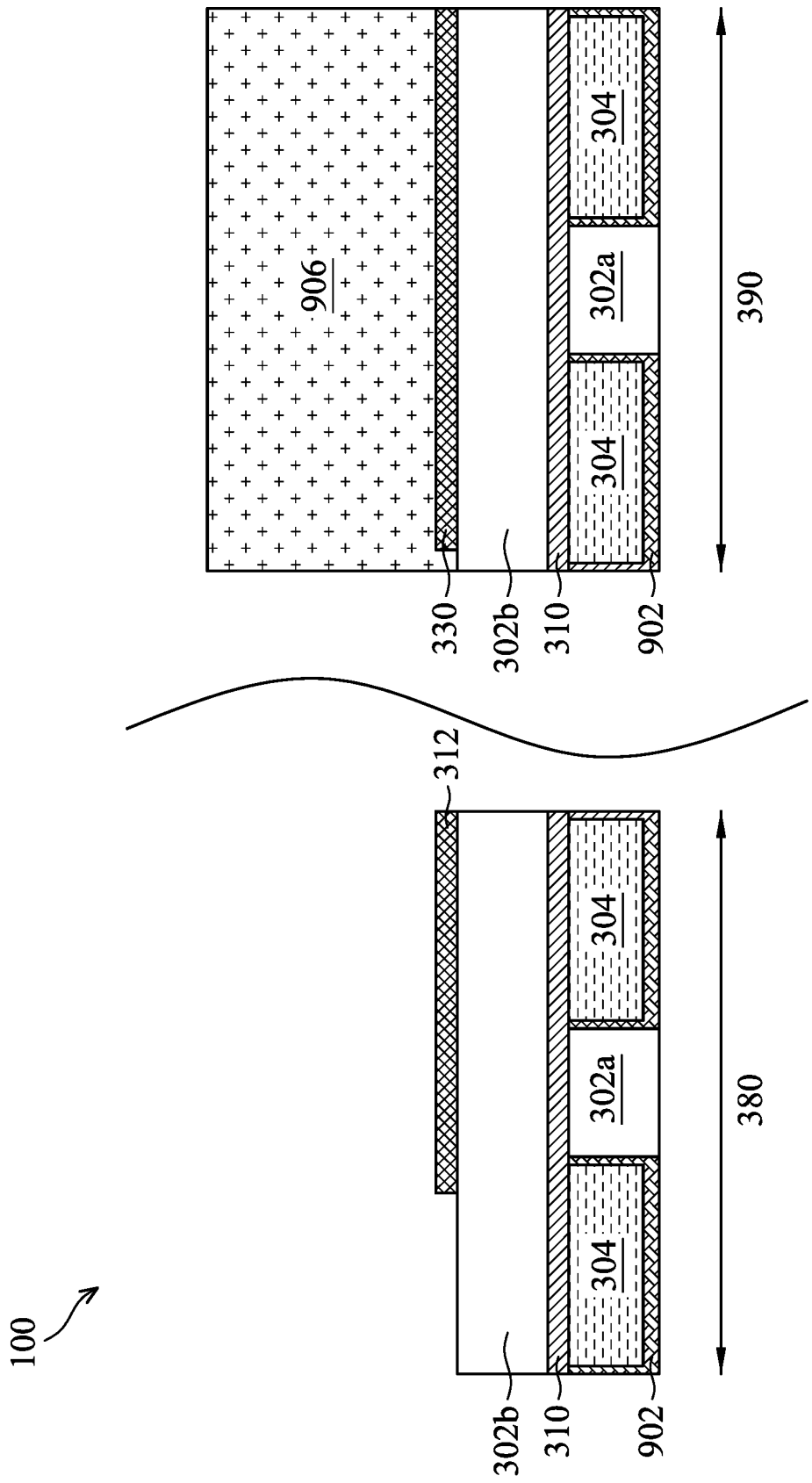

INTERCONNECT STRUCTURE AND METHODS OF FORMING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Passive components, such as capacitors, resistors, and inductors, may be part of the IC along with active components, such as transistors. Although existing processes for manufacturing passive components have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-9I are cross-sectional side views of various stages of manufacturing the interconnect structure, in accordance with some embodiments.

DETAILED DESCRIPTION

Figure 1A:
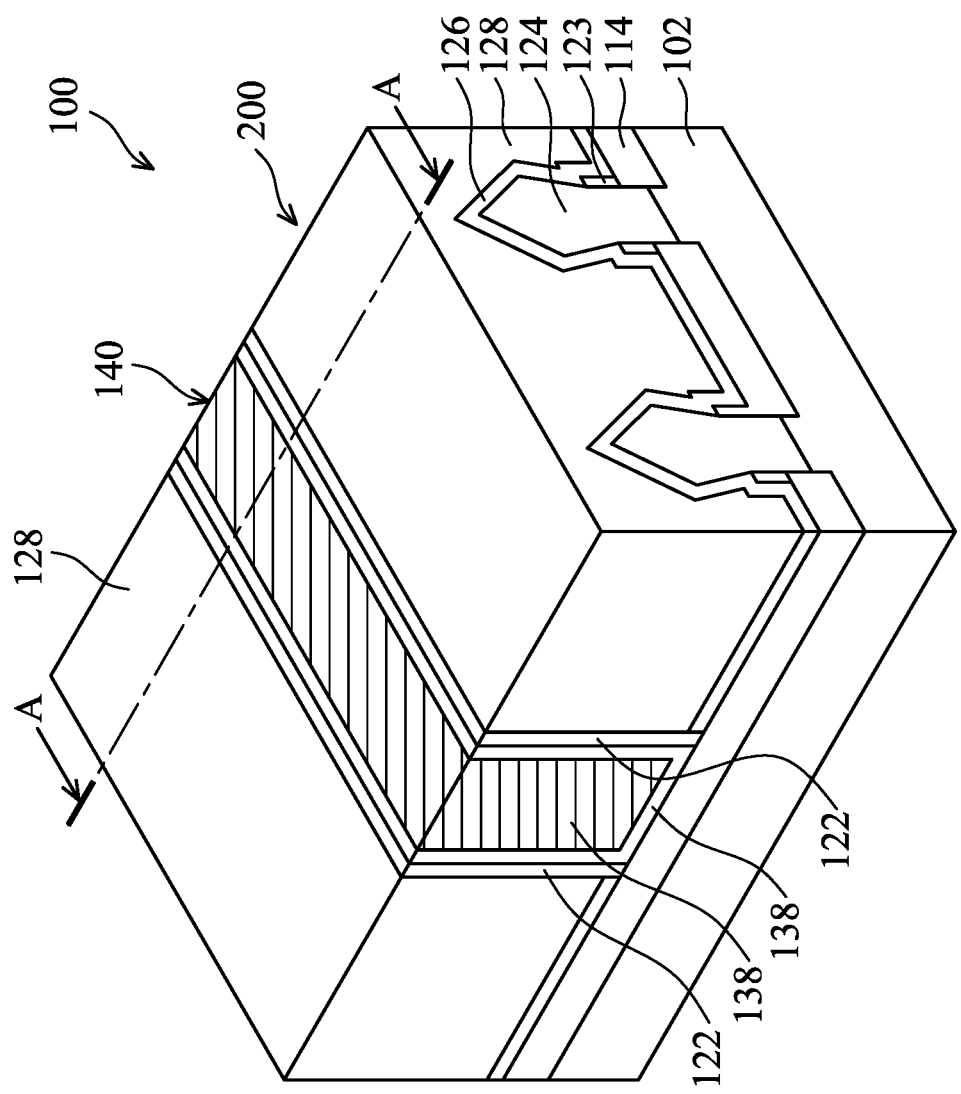
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
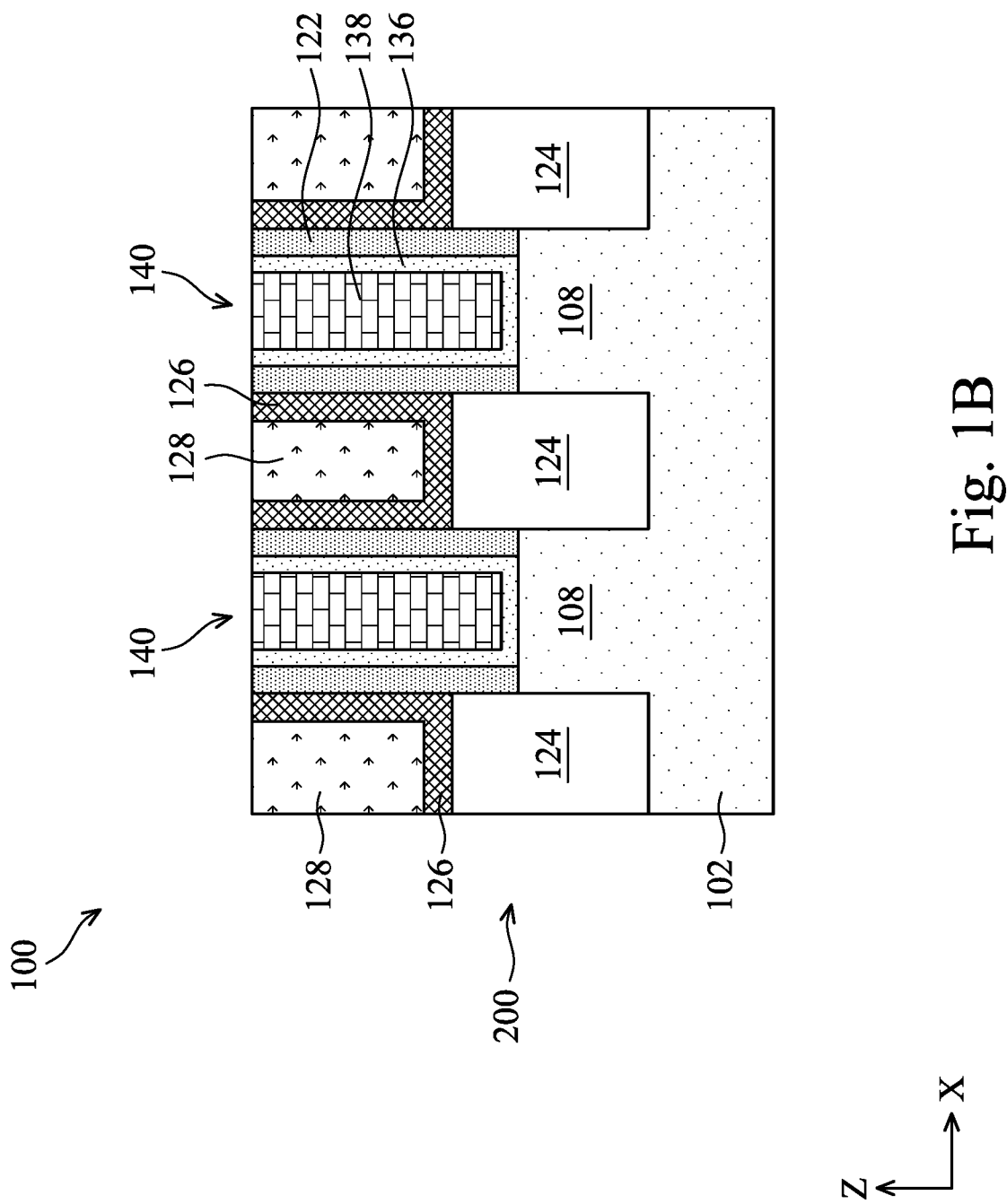
FIG. 1B is a cross-sectional side view of the stage of manufacturing the semiconductor device structure taken along line A-A of FIG. 1A, in accordance with some embodiments.

FIGS. 1A and 1B illustrate a stage of manufacturing a semiconductor device structure 100. As shown in FIGS. 1A and 1B, the semiconductor device structure 100 includes a substrate 102 and one or more devices 200 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include one or more buffer layers (not shown) on the surface of the substrate 102. The buffer layers can serve to gradually change the lattice constant from that of the substrate to that of the source/drain regions. The buffer layers may be formed from epitaxially grown crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the devices 200 may be any suitable devices, such as transistors, diodes, imaging sensors, resistors, capacitors, inductors, memory cells, or a combination thereof. In some embodiments, the devices 200 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device 200 formed on the substrate 102 is a FinFET, which is shown in FIGS. 1A and 1B. The device 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. Channel regions 108 are formed between S/D regions 124 serving as source regions and S/D regions 124 serving as drain regions.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions 108 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, the channel regions 108 include the same semiconductor material as the substrate 102. In some embodiments, the devices 200 are FinFETs, and the channel regions 108 are a plurality of fins disposed below the gate stacks 140. In some embodiments, the devices 200 are nanostructure transistors, and the channel regions 108 are surrounded by the gate stacks 140.

As shown in FIGS. 1A and 1B, each gate stack 140 includes a gate electrode layer 138 disposed over the channel region 108 (or surrounding the channel region 108 for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 140 may further include a gate dielectric layer 136 disposed over the channel region 108. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layers 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique.

As shown in FIG. 1A, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

As shown in FIGS. 1A and 1B, a contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

A conductive contact (not shown) may be disposed in the ILD layer 128 and over the S/D region 124. The conductive contact may be electrically conductive and include a material having one or more of Ru, Mo, Co, Ni. W, Ti, Ta, Cu, Al, TiN or TaN, and the conductive contact may be formed by any suitable method, such as electro-chemical plating (ECP), or PVD. A silicide layer (not shown) may be disposed between the conductive contact and the S/D region 124.

Figure 2:
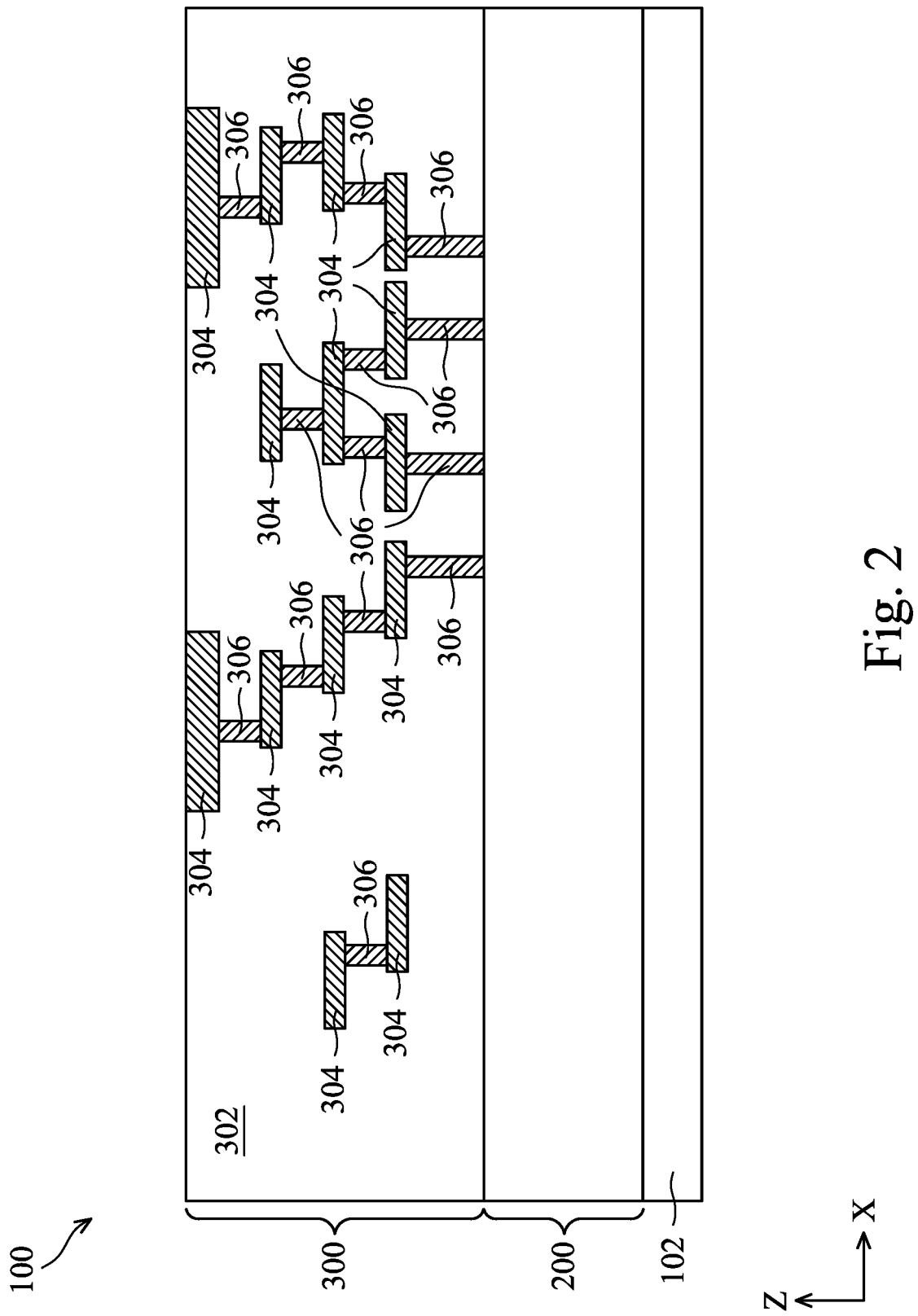
FIG. 2 is a cross-sectional side view of a stage of manufacturing the semiconductor device structure, in accordance with some embodiments.

The semiconductor device structure 100 may further includes an interconnection structure 300 disposed over the devices 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices 200 disposed below. The conductive features 306 provide vertical electrical routing from the devices 200 to the conductive features 304 and between conductive features 304. For example, the bottommost conductive features 306 of the interconnection structure 300 may be electrically connected to the conductive contacts disposed over the S/D regions 124 (FIG. 1B) and the gate electrode layer 138 (FIG. 1B). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a dielectric material having a k value ranging from about 1 to about 5. Passive components (not shown), such as capacitors, resistors, and/or inductors, may be disposed in the interconnect structure 300.

Figure 3:
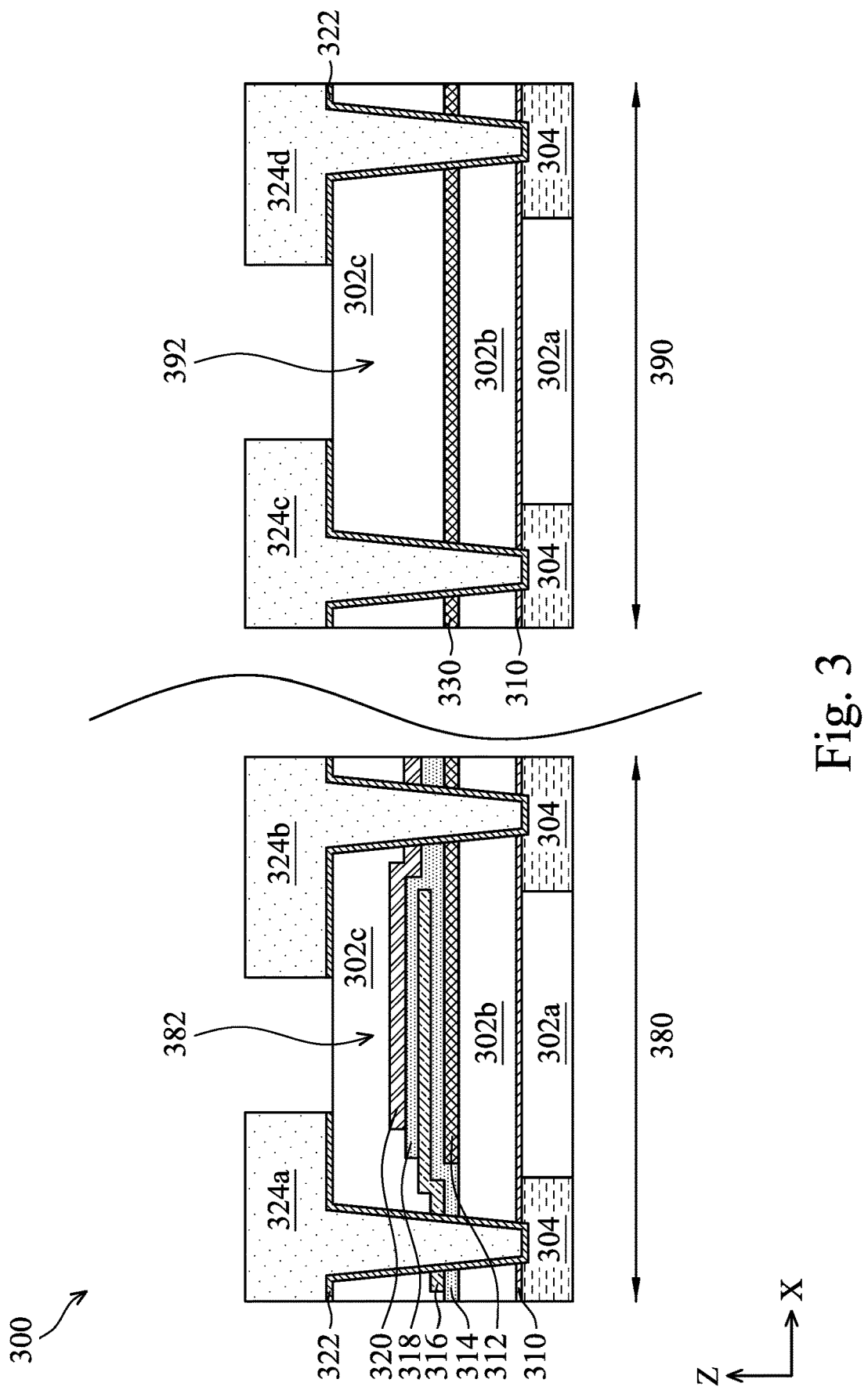
FIG. 3 is a cross-sectional side view of a top portion of an interconnect structure, in accordance with some embodiments.

FIG. 3 is a cross-sectional side view of a top portion of an interconnect structure 300, in accordance with some embodiments. As shown in FIG. 3, the interconnect structure 300 further includes passive components 382, 392 disposed therein. In some embodiments, the passive component 382 is a capacitor, such as a metal-insulator-metal (MIM) capacitor, and the passive component 392 is a resistor. The passive component 382 is disposed in a region 380 of the semiconductor device structure 100, and the passive component 392 is disposed in a region 390 of the semiconductor device structure 100. In some embodiments, the region 380 may be a capacitor region, and the region 390 may be a resistor region. The region 380 may be located adjacent the region 390, or the region 380 and the region 390 are located in different areas of the substrate 102. In other words, the regions 380, 390 may be located next to each other or located spaced apart from each other.

As shown in FIG. 3, the passive component 382 includes a first conductive layer 312, a first insulating layer 314 disposed on the first conductive layer 312, a second conductive layer 316 disposed on the first insulating layer 314, a second insulating layer 318 disposed on the second conductive layer 316 and the first insulating layer 314, and a third conductive layer 320 disposed on the second insulating layer 318. The second conductive layer 316 may be partially overlapping with the first conductive layer 312, and the third conductive layer 320 may be partially overlapping with the second conductive layer 316. Each of the first, second, and third conductive layers 312, 316, 320 includes an electrically conductive material, such as titanium (Ti), titanium nitride (TiN), tantalum (Ta), tantalum nitride (TaN), copper (Cu), copper alloy, aluminum (Al), aluminum alloy, copper aluminum alloy (AlCu), tungsten (W), tungsten alloy, or other suitable material. Each of the first, second, and third conductive layers 312, 316, 320 has a thickness ranging from about 20 nm to about 100 nm. Each of the first and second insulating layers 314, 318 includes an electrically insulating material, such as a high-k dielectric material. In some embodiments, each of the first and second insulating layers 314, 318 includes zirconium dioxide ($ZrO_2$), aluminum oxide ($Al_2O_3$), titanium oxide ($Ti_xO_y$), tantalum oxide ($Ta_xO_y$), titanium oxide nitride ($Ti_xO_yN_z$), tantalum oxide nitride ($Ta_xO_yN_x$), where x, y, and z can be integers or non-integers, or other suitable material. Each of the first and second insulating layers 314, 318 has a thickness ranging from about 1 nm to about 10 nm.

As shown in FIG. 3, the interconnect structure 300 includes conductive features 304 disposed in a first IMD layer 302a in both regions 380, 390. The conductive features 304 may be the topmost conductive features 304 shown in FIG. 2. An etch stop layer 310 is disposed on the first IMD layer 302a, and a second IMD layer 302b is disposed on the etch stop layer 310. The etch stop layer 310 may include an oxide or a nitride of a metal, such as Al, Ti, Zr, Hf, Y, or other suitable metal. In some embodiments, the etch stop layer 310 includes an oxide or a nitride of a semiconductor, such as silicon. The etch stop layer 310 may be formed by any suitable process, such as CVD or ALD. A third IMD layer 302c is disposed on the passive component 382. Conductive features 324a, 324b are disposed through the etch stop layer 310, the second IMD layer 302b, the passive component 382, and the third IMD layer 302c. In some embodiments, the conductive features 324a, 324b are redistribution layers (RDLs). The conductive feature 324a is electrically connected to the second conductive layer 316 of the passive component 382, and the conductive feature 324b is electrically connected to the first and third conductive layers 312, 320 of the passive component 382. Each conductive feature 324a, 324b is aligned with a corresponding conductive feature 304 disposed in the first IMD layer 302a. In some embodiments, a barrier layer 322 is disposed between each conductive feature 324a, 324b and the etch stop layer 310, the second IMD layer 302b, the passive component 382, and the third IMD layer 302c. Each conductive feature 324a, 324b includes an electrically conductive material, such as Cu, AlCu, or other suitable material. The barrier layer 322 includes an electrically conductive material, such as Ti, Ta, TiN, TaN, or other suitable material. In some embodiments, the barrier layers 322 are in contact with corresponding conductive features 304, and the conductive features 324a, 324b are in contact with corresponding barrier layers 322.

As shown in FIG. 3, in the region 390, the passive component 392 includes a conductive layer 330 disposed on the second IMD layer 302b. The third IMD layer 302c is disposed on the conductive layer 330. Conductive features 324c, 324d are disposed through the etch stop layer 310, the second IMD layer 302b, the passive component 392, and the third IMD layer 302c. In some embodiments, the conductive features 324c, 324d are RDLs. The conductive features 324c, 324d are both electrically connected to the conductive layer 330 of the passive component 392. Each conductive feature 324c, 324d is aligned with a corresponding conductive feature 304 disposed in the first IMD layer 302a. In some embodiments, the barrier layer 322 is disposed between each conductive feature 324c, 324d and the etch stop layer 310, the second IMD layer 302b, the passive component 392, and the third IMD layer 302c. The conductive features 324c, 324d includes the same material as the conductive features 324a, 324b. In some embodiments, the barrier layers 322 are in contact with corresponding conductive features 304, and the conductive features 324c, 324d are in contact with corresponding barrier layers 322.

In some embodiments, the first, second, and third conductive layers 312, 316, 320 of the passive component 382 include the same material, and the conductive layer 330 of the passive component 392 include the same material as the first, second, and third conductive layers 312, 316, 320. In some embodiments, the first conductive layer 312 includes a first material, the second and third conductive layers 316, 320 include a second material, and the conductive layer 330 include the first material. The first material has a substantially greater electrical resistivity than the second material. In some embodiments, the second conductive layer 316 includes a first material, the first and third conductive layers 312, 320 include a second material, and the conductive layer 330 include the first material. The first material has a substantially greater electrical resistivity than the second material. In some embodiments, the third conductive layer 320 includes a first material, the first and second conductive layers 312, 316 include a second material, and the conductive layer 330 include the first material. The first material has a substantially greater electrical resistivity than the second material. In some embodiments, the conductive layer 330 has the same thickness as the first, second, and third conductive layers 312, 316, 320. In some embodiments, the conductive layer 330 has a thickness less than the thickness of the first, second, and third conductive layers 312, 316, 320.

Figures 4A, 4B:
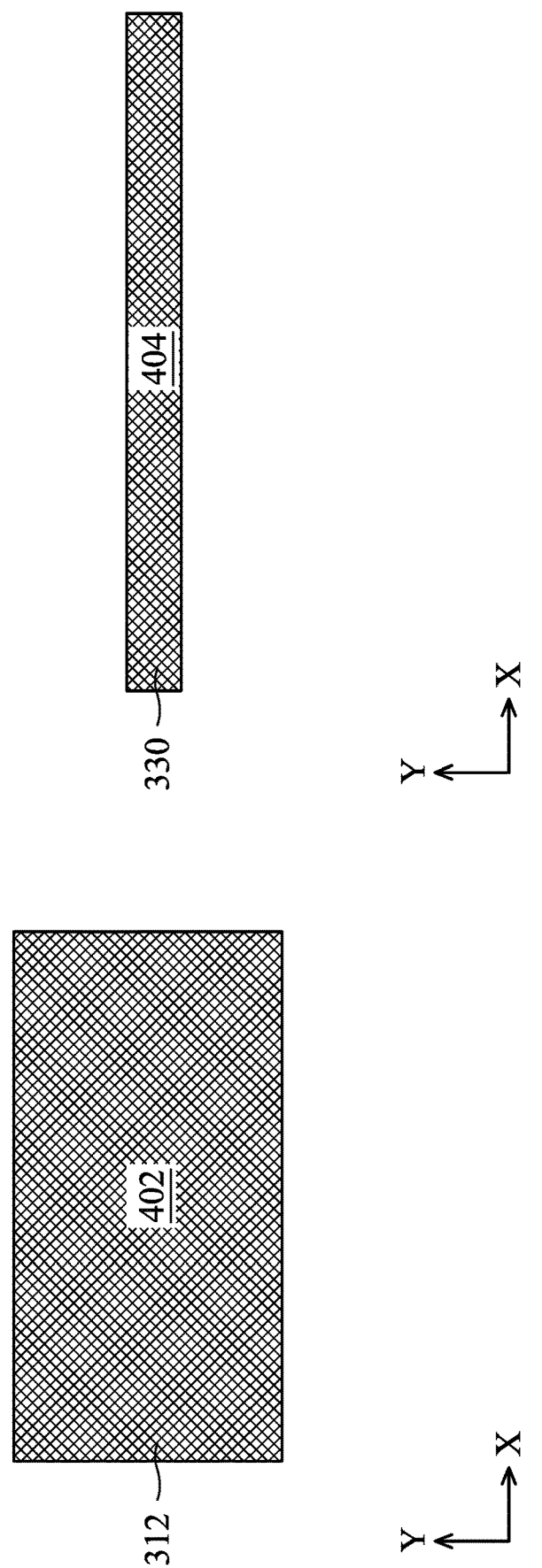
FIGS. 4A and 4B are plan views of conductive layers of passive components disposed in the interconnect structure, in accordance with some embodiments.

As described above, the passive component 382 may be a capacitor, and the passive component 392 may be a resistor. Even though the conductive layer 330 of the passive component 392 may include the same material as at least one of the first, second, and third conductive layers 312, 316, 320 of the passive component 382, the conductive layer 330 has substantially less electrical resistance due to the dimensions of the conductive layer 330, which are much smaller than the dimensions of the conductive layers 312, 316, or 320. FIGS. 4A and 4B are plan views of conductive layers 312, 330 of passive components 382, 392, respectively, in accordance with some embodiments. As shown in FIGS. 4A and 4B, the conductive layer 312 (or the conductive layer 316 or 320) has a major surface 402, and the conductive layer 330 has a major surface 404. The major surface 402 is substantially greater than the major surface 404. As a result, the conductive layer 330 of the passive component 392 functions as a resistor in a circuit. In some embodiments, the conductive layer 330 has an electrical resistance in the tens of thousands of ohms.

Figure 5:
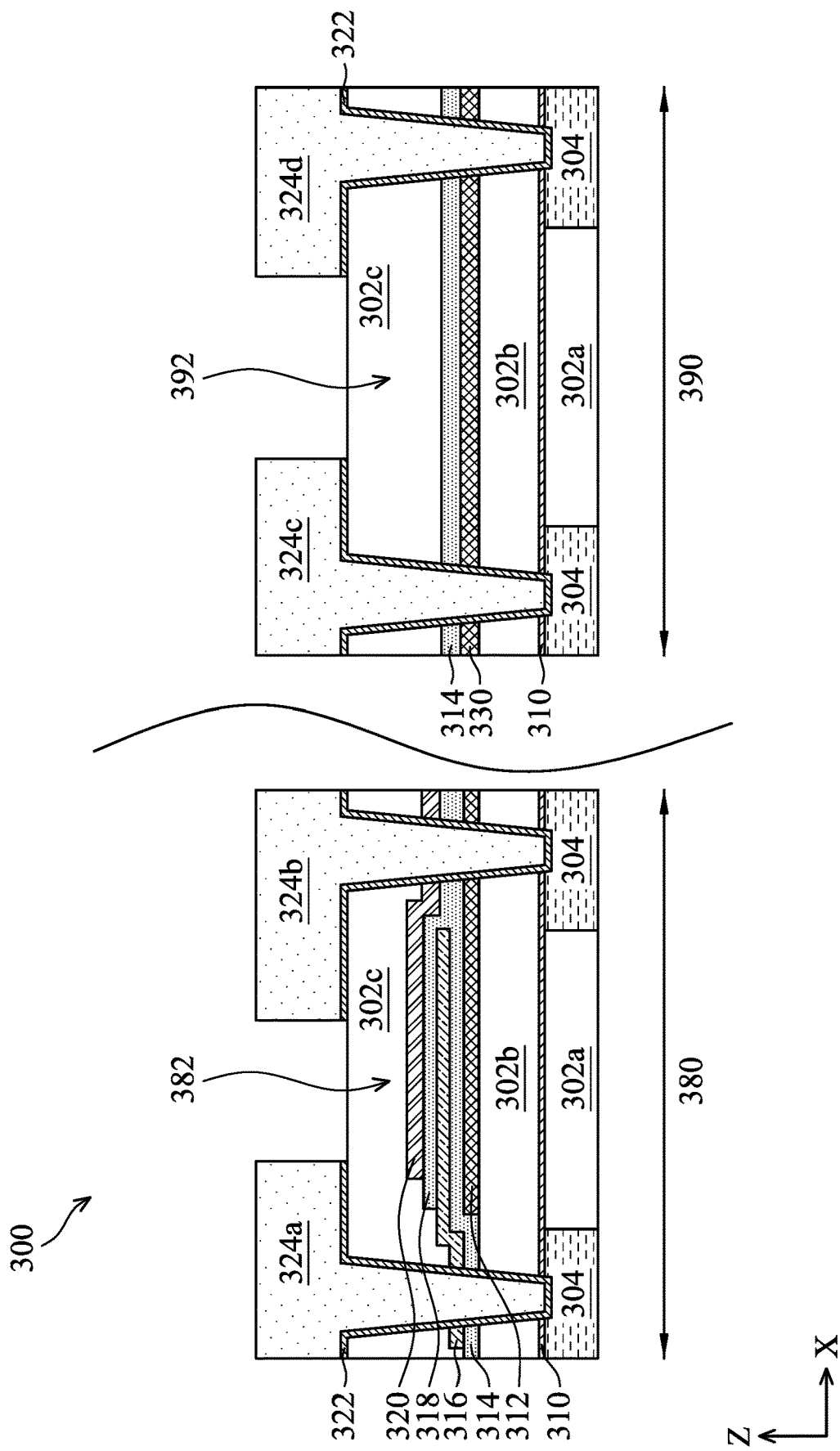
FIGS. 5-8 are cross-sectional side views of the top portion of the interconnect structure, in accordance with alternative embodiments.

FIGS. 5-8 are cross-sectional side views of the top portion of the interconnect structure 300, in accordance with alternative embodiments. As shown in FIG. 5, the first insulating layer 314 is disposed on the conductive layer 330 in the region 390, and the third IMD layer 302c is disposed on the insulating layer 314 in the region 390. The first conductive layer 312 of the passive component 382 and the conductive layer 330 of the passive component 392 may be formed by the same patterning process, and the first insulating layer 314 is disposed on the first conductive layer 312 and the conductive layer 330.

Figure 6:
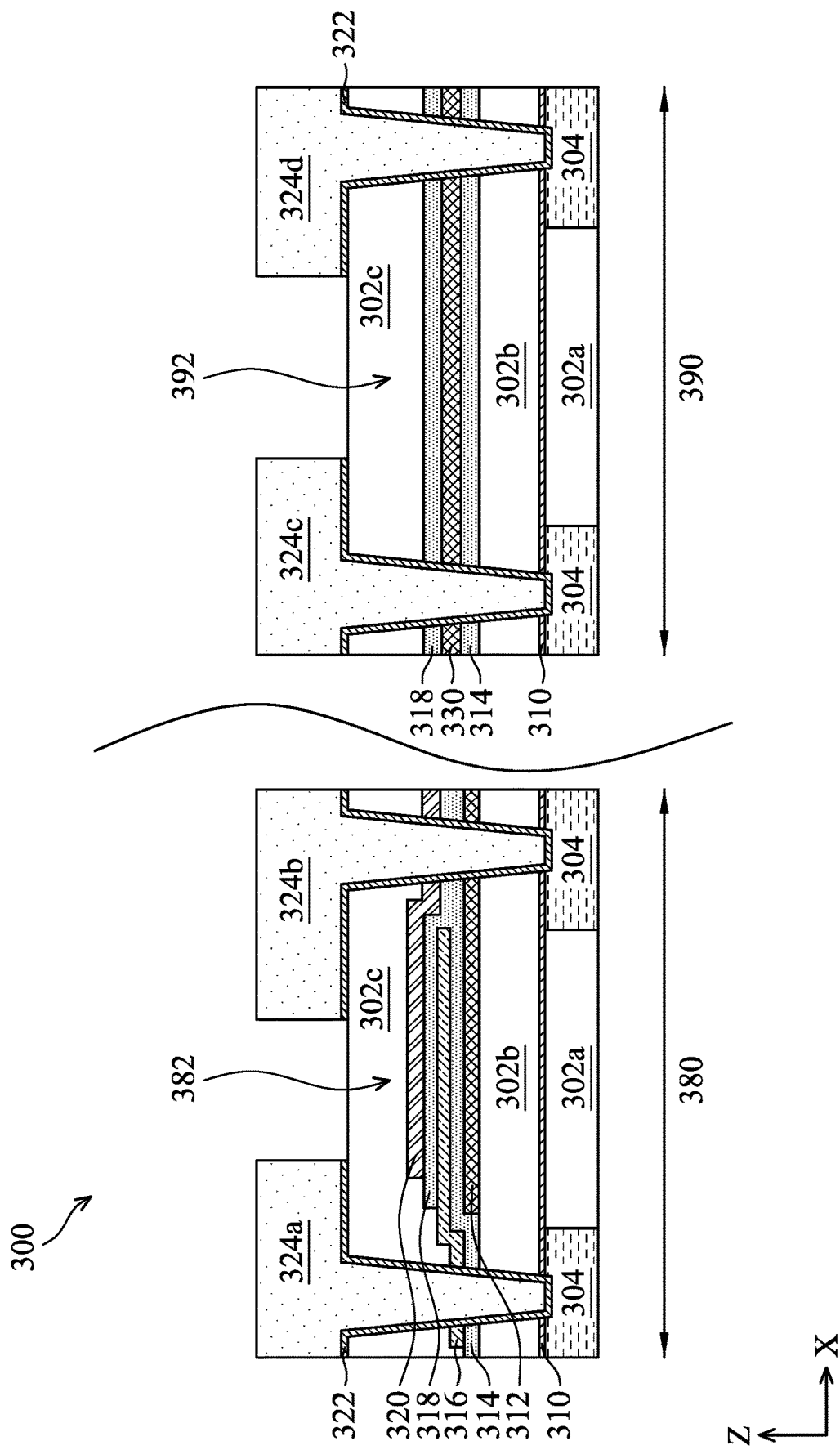
Figure 7:
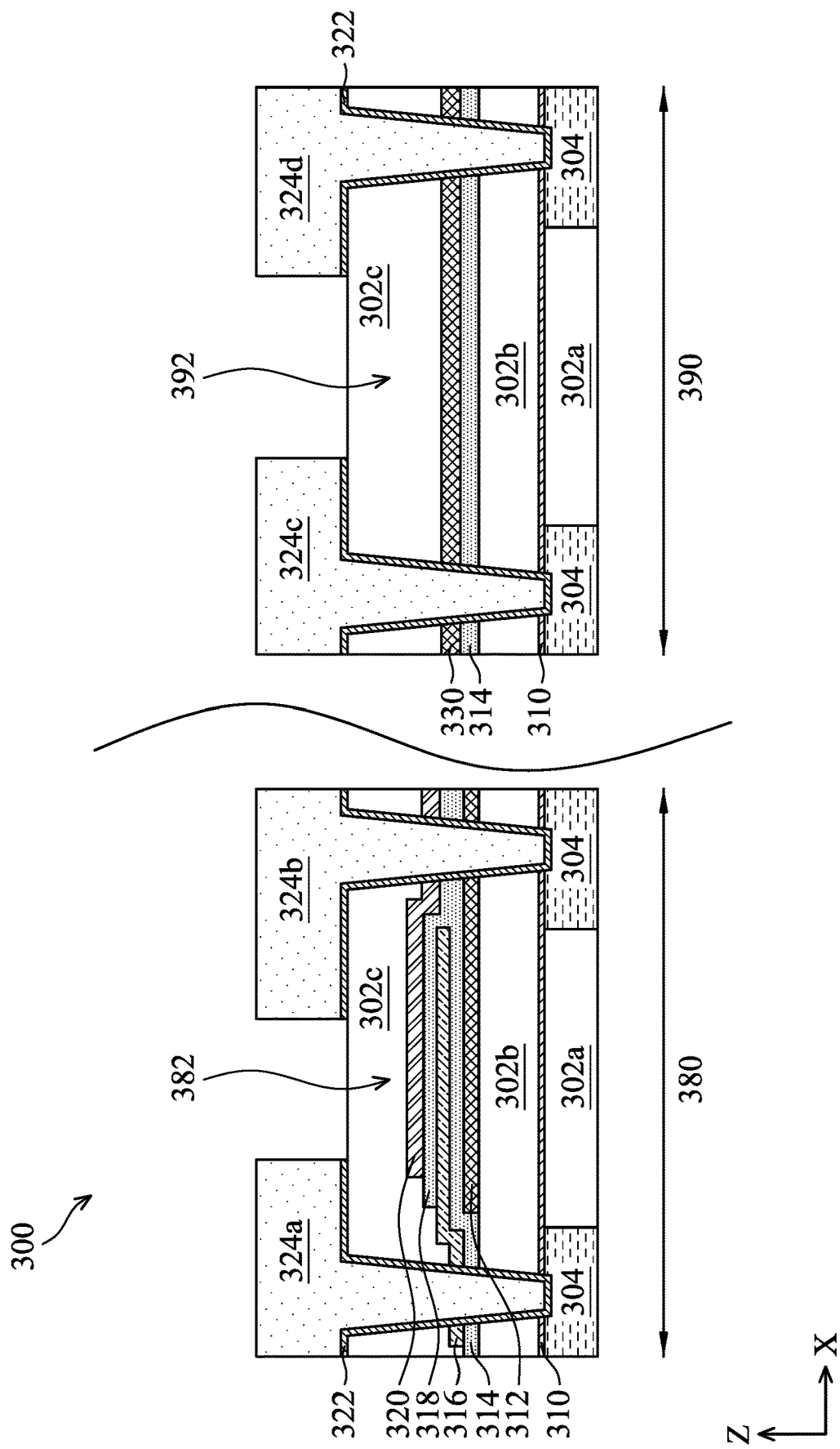

As shown in FIG. 6, the conductive layer 330 of the passive component 392 is disposed between the first insulating layer 314 and the second insulating layer 318, and the third IMD layer 302c is disposed on the second insulating layer 318 in the region 390. The first insulating layer 314 is disposed in both regions 380, 390, the second conductive layer 316 of the passive component 382 and the conductive layer 330 of the passive component 392 may be formed by the same patterning process, and the second insulating layer 318 is disposed on the second conductive layer 316 and the conductive layer 330. In some embodiments, the second insulating layer 318 is not formed in the region 390, as shown in FIG. 7, and the third IMD layer 302c is disposed on the conductive layer 330 in the region 390.

Figure 8:
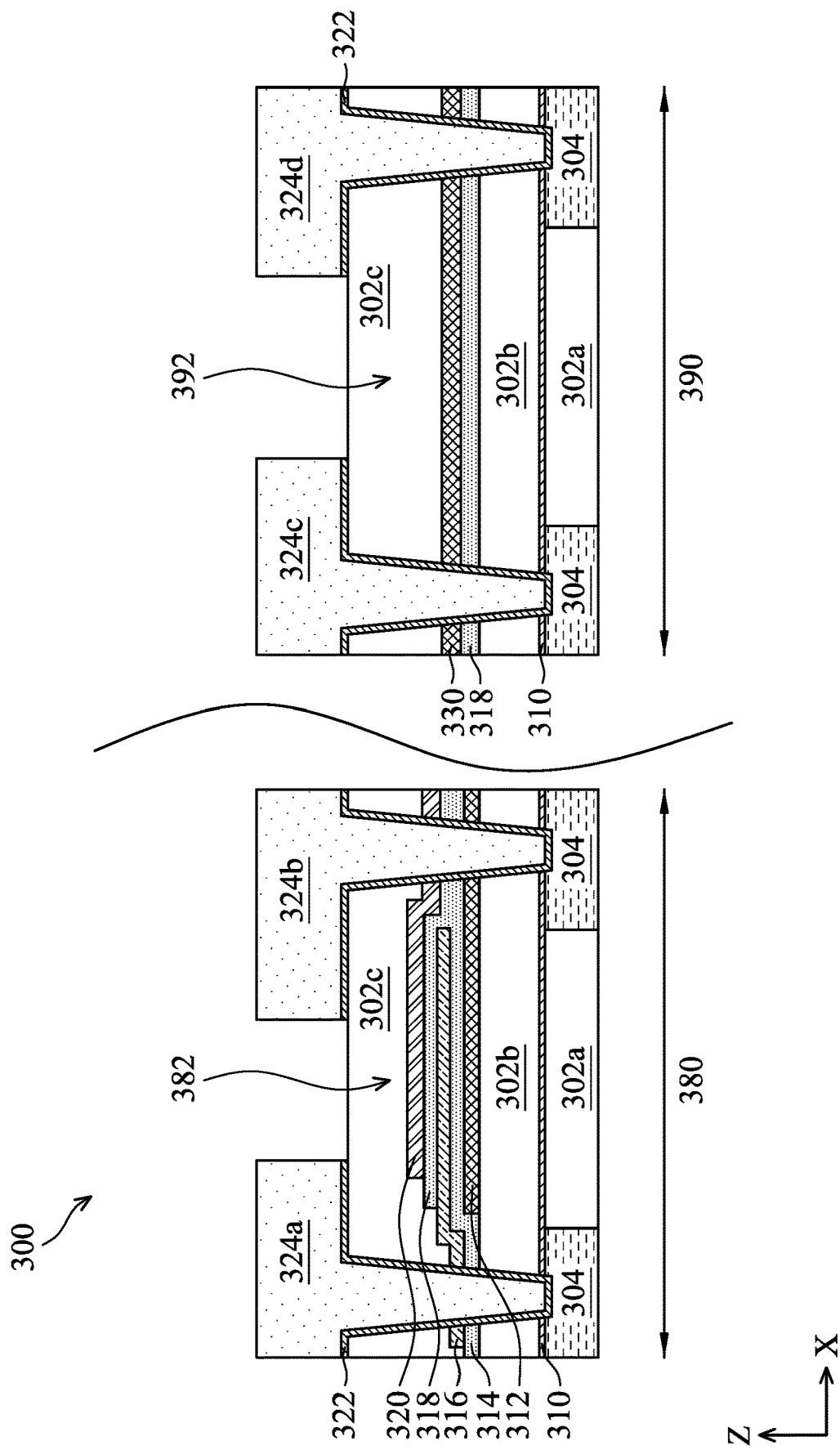

As shown in FIG. 8, the second insulating layer 318 may be disposed on the second IMD layer 302b in the region 390, and the conductive layer 330 is disposed on the second insulating layer 318. The third conductive layer 320 of the passive component 382 and the conductive layer 330 of the passive component 392 may be formed by the same patterning process.

Figure 9A:
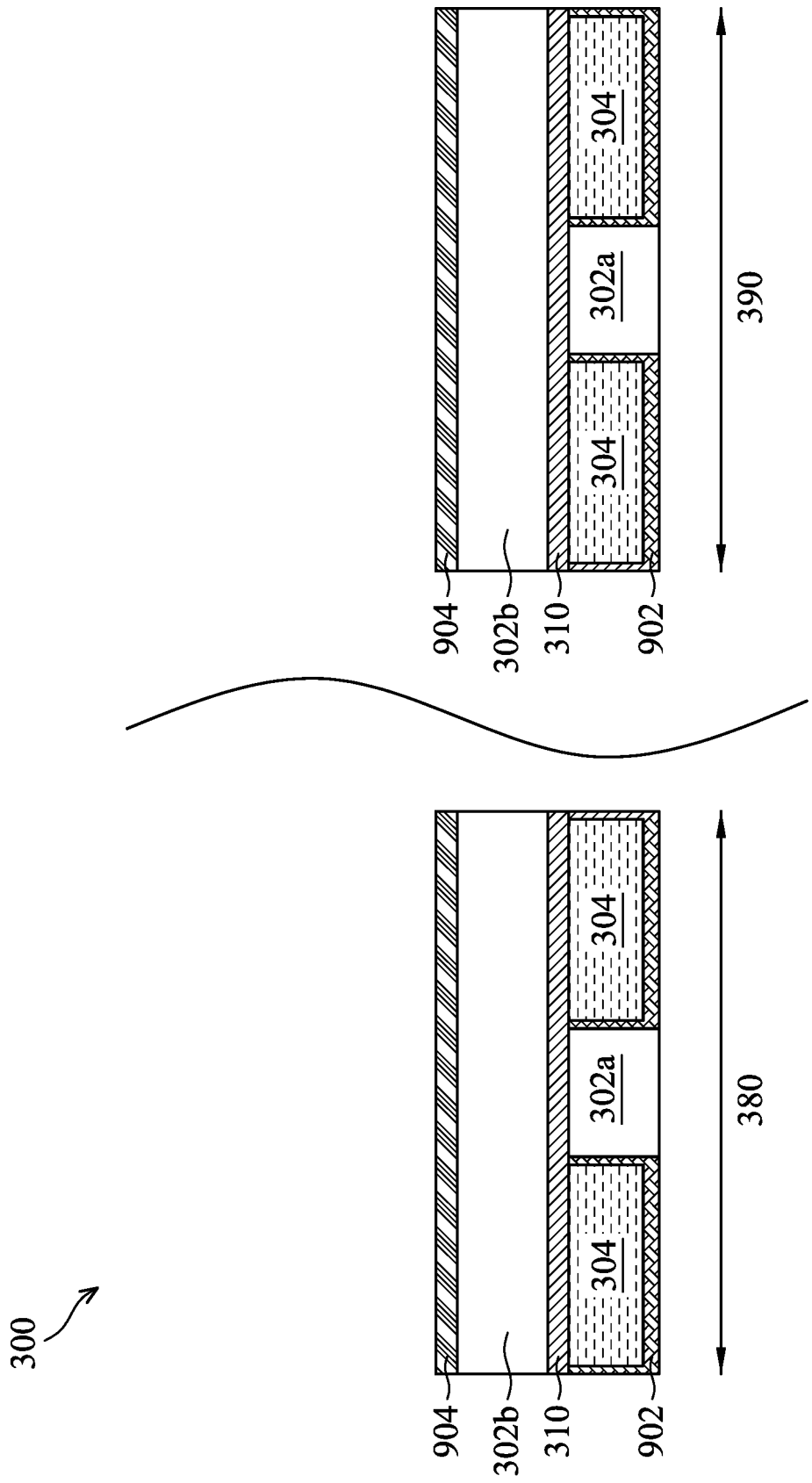

FIGS. 9A-9I are cross-sectional side views of various stages of manufacturing the interconnect structure 300, in accordance with some embodiments. As shown in FIG. 9A, a barrier layer 902 is disposed between each conductive feature 304 and the first IMD layer 302a. The etch stop layer 310 is disposed on the first IMD layer 302a in regions 380, 390, and the second IMD layer 302b is disposed on the etch stop layer 310 in regions 380, 390. A conductive layer 904 is formed on the second IMD layer 302b in regions 380, 390. The conductive layer 904 may be a blanket layer formed by any suitable process, such as ECP, PVD, or ALD.

Figure 9B:
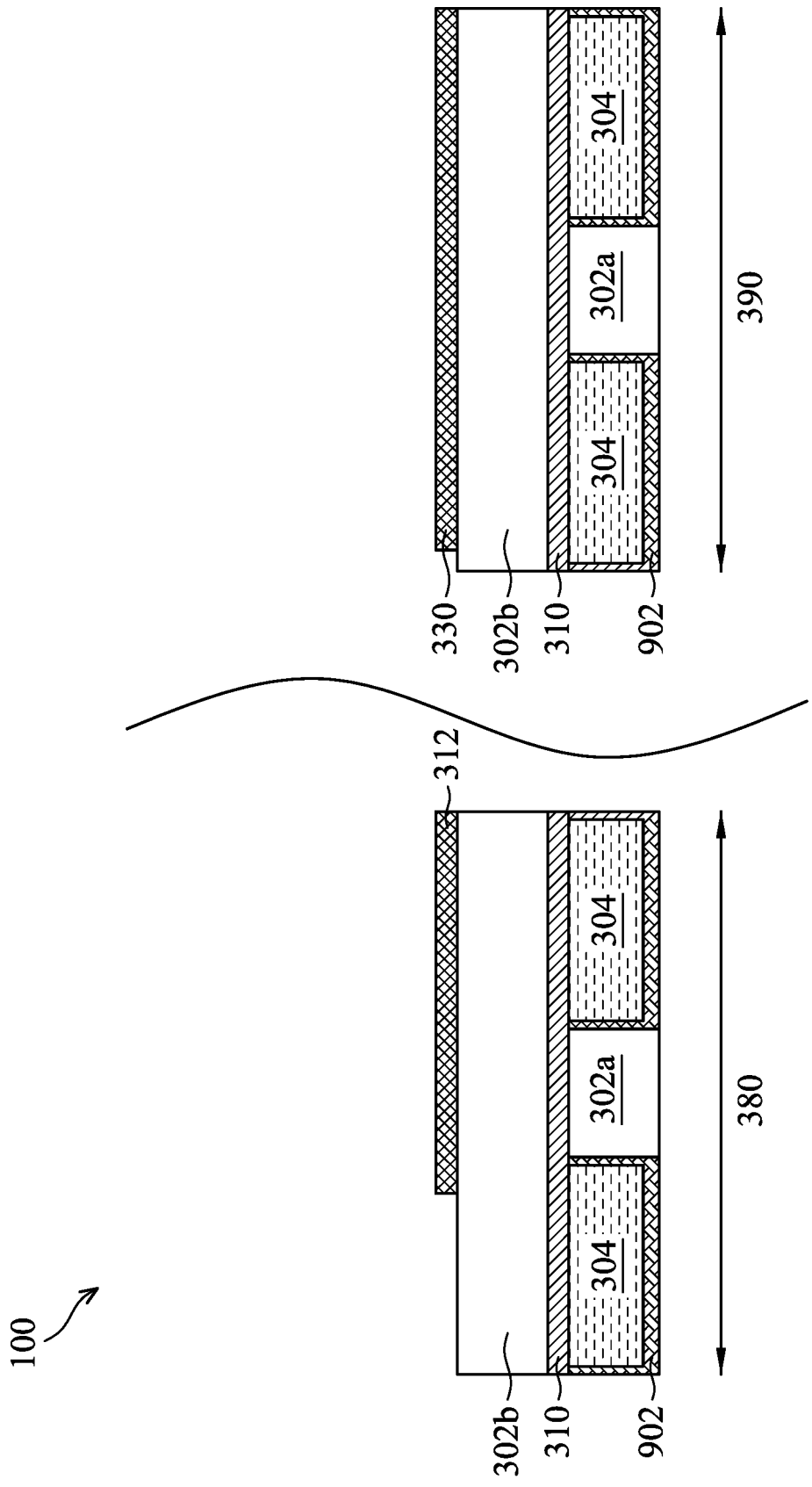

As shown in FIG. 9B, a patterning process is performed on the conductive layer 904, and the first conductive layer 312 and the conductive layer 330 are formed in the region 380, 390, respectively. The patterning process may include forming a mask (not shown) on the conductive layer 904, patterning the mask, and transferring the pattern of the mask to the conductive layer 904 by removing portions of the conductive layer 904. The first conductive layer 312 and the conductive layer 330 are formed by the same patterning process. In other words, the first conductive layer 312 and the conductive layer 330 are formed simultaneously.

As shown in FIG. 9C, a mask is formed in the region 390 to cover the conductive layer 330 and a portion of the second IMD layer 302b. The mask may include any suitable material, such as a photoresist or a bottom anti-reflective coating (BARC) layer. The mask 906 does not cover the first conductive layer 312 and portions of the second IMD layer 302b in the region 380.

Figure 9D:
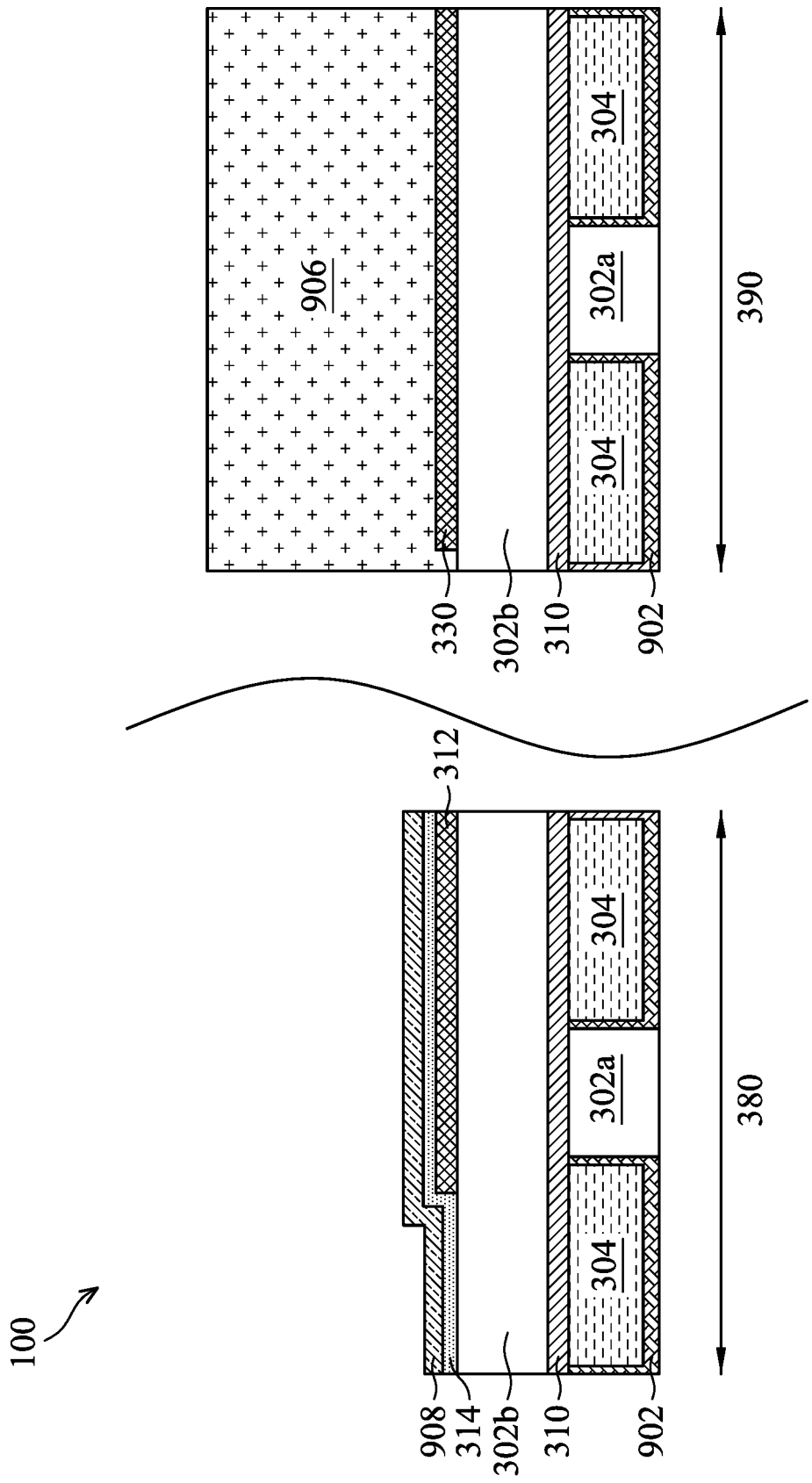

As shown in FIG. 9D, the first insulating layer 314 is formed on a portion of the second IMD layer 302b and on the first conductive layer 312 in the region 380, and a conductive layer 908 is formed on the first insulating layer 314 in the region 380. The conductive layer 908 may be a blanket layer formed by any suitable process, such as ECP, PVD, or ALD. The portions of the first insulating layer 314 and the portions of the conductive layer 908 formed on the mask 906 in the region 390 are not shown in FIG. 9D.

Figure 9E:
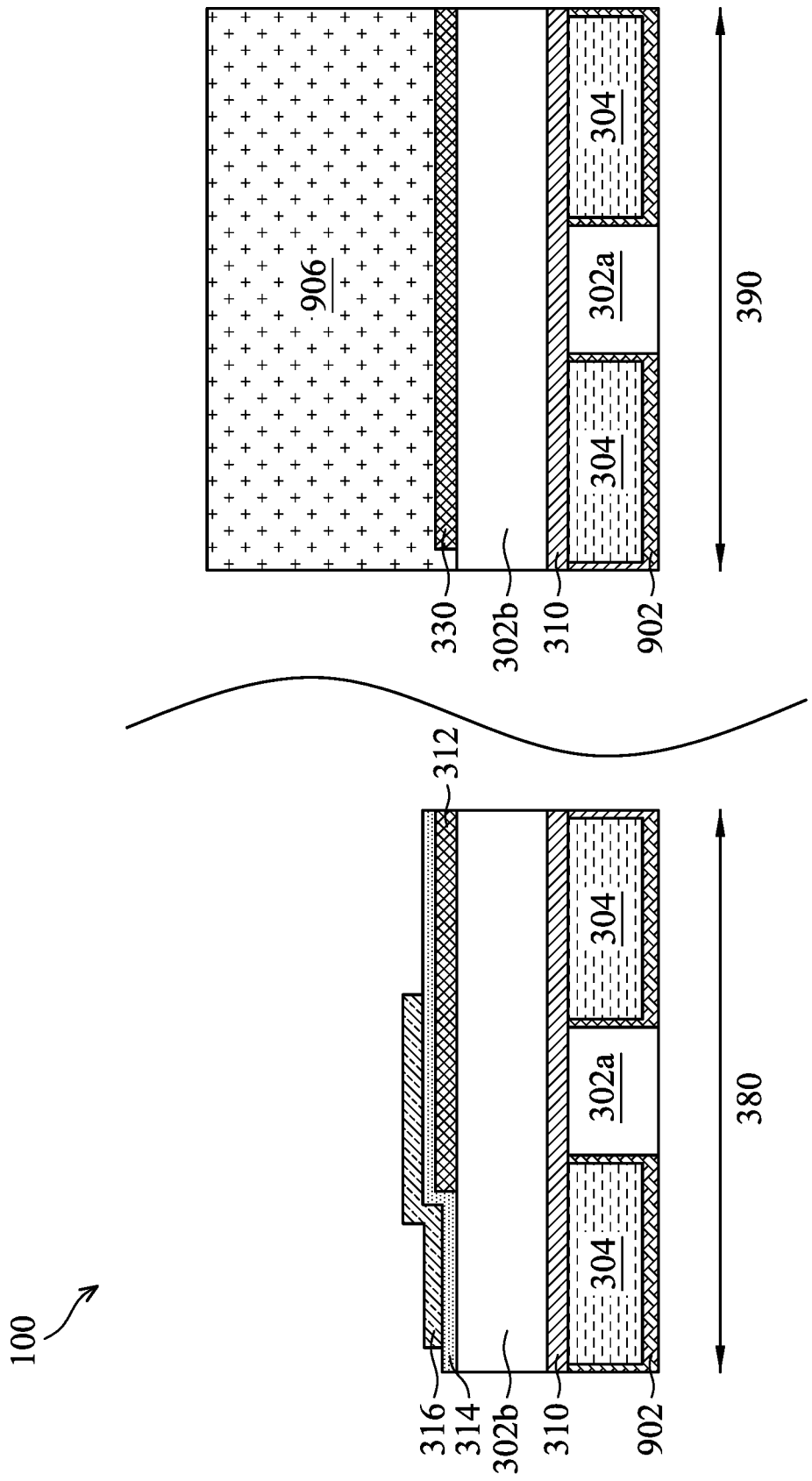

As shown in FIG. 9E, a patterning process is performed on the conductive layer 908, and the second conductive layer 316 is formed in the region 380. The portion of the conductive layer 908 formed over the mask 906 in the region 390 may be also removed by the patterning process. The patterning process may include forming a mask (not shown) on the conductive layer 908, patterning the mask, and transferring the pattern of the mask to the conductive layer 908 by removing portions of the conductive layer 908.

Figure 9F:
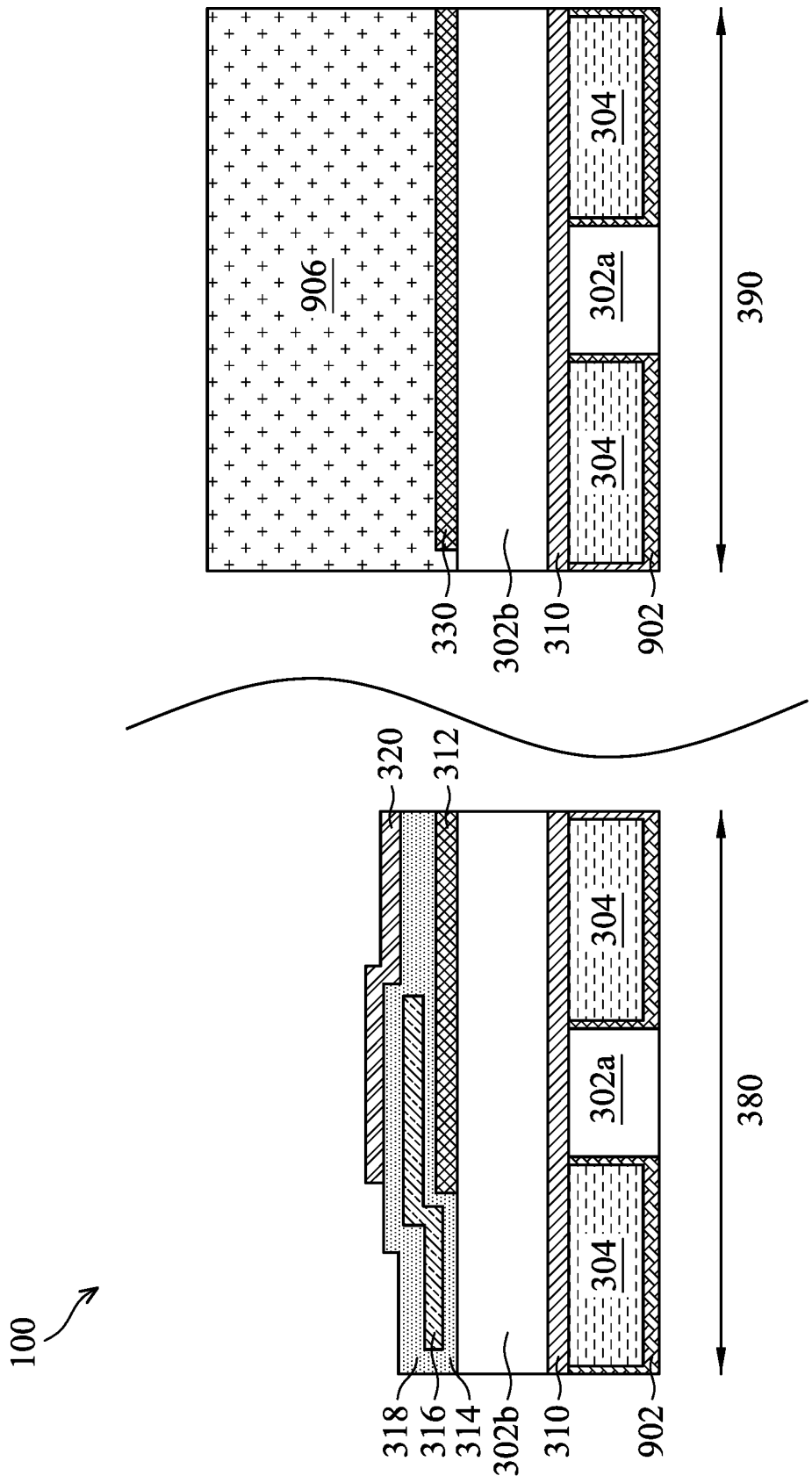

As shown in FIG. 9F, the second insulating layer 318 is formed on a portion of the first insulating layer 314 and on the second conductive layer 316 in the region 380, and the third conductive layer 320 is formed on the second insulating layer 318 in the region 380. The third conductive layer 320 may be formed by first forming a blanket conductive layer on the second insulating layer 318 and then patterning the blanket conductive layer. The portion of the second insulating layer 318 formed on the mask 906 in the region 390 are not shown in FIG. 9F.

Figure 9G:
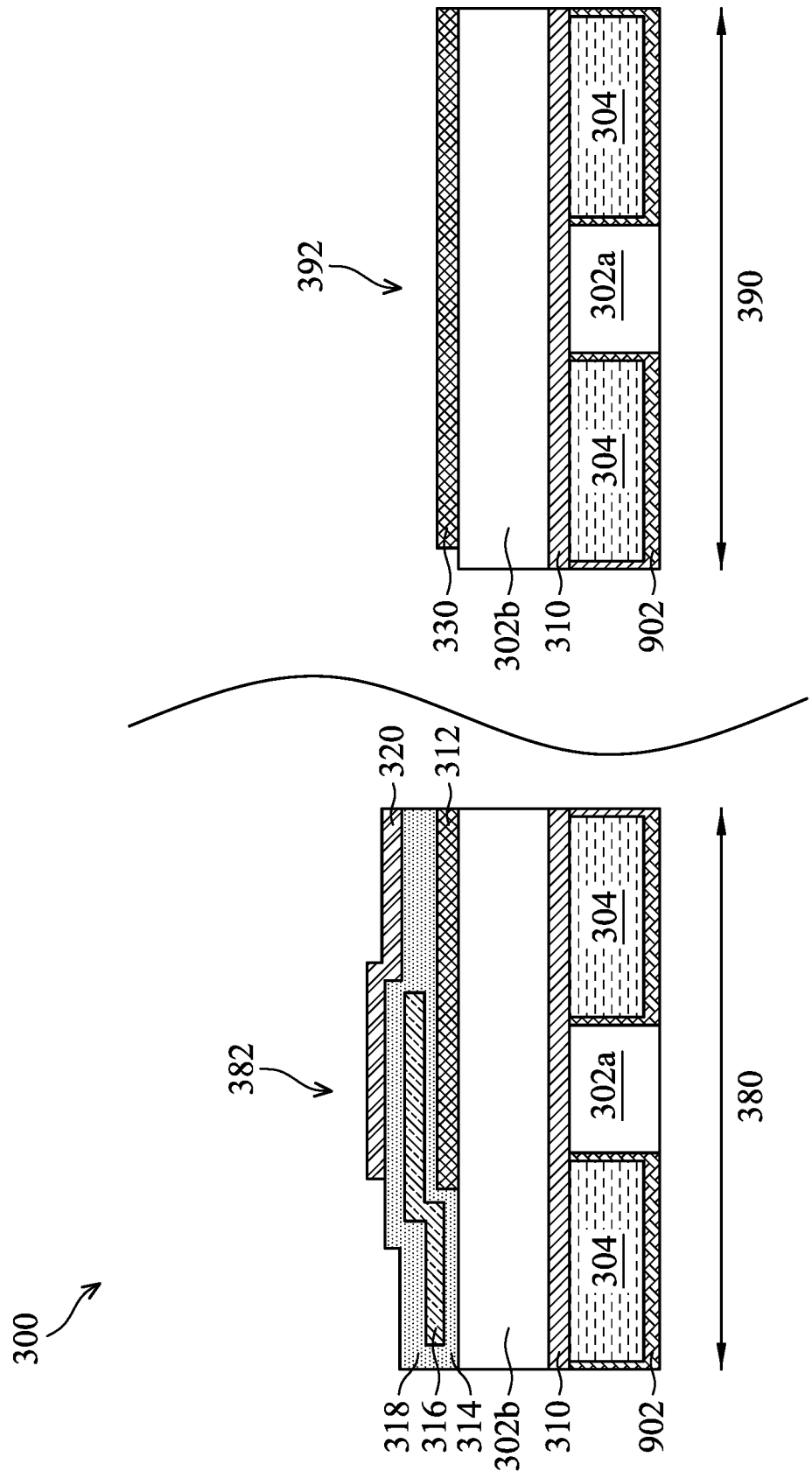

As shown in FIG. 9G, the mask 906 along with the materials formed thereon are removed by any suitable process. As a result, the conductive layer 330 and a portion of the second IMD layer 302b are exposed in the region 390. As shown in FIG. 9G, the passive component 382, such as a capacitor, is formed on the second IMD layer 302b in the region 380, and the passive component 392, such as a resistor, is formed on the second IMD layer 302b in the region 390. In some embodiments, a mask (not shown) may be formed on the passive component 382 to protect the passive component 382 prior to removing the mask 906 and the materials formed thereon. A planarization process, such as a chemical-mechanical polishing (CMP) process, may be performed to expose the mask 906 in the region 390, and the mask 906 and the mask (not shown) formed on the passive component 382 may be removed by a selective etching process that does not substantially affect the third conductive layer 320, the conductive layer 330, the second insulating layer 318, and the second IMD layer 302b.

The conductive layer 330 of the passive component 392 is formed at the same time as the first conductive layer 312 of the passive component 382, as described in FIGS. 9A to 9G. However, the conductive layer 330 of the passive component 392 may be formed at the same time as the second conductive layer 316 or the third conductive layer 320 of the passive component 382 by forming the mask 906 at different times. For example, in some embodiments, the mask 906 may be formed on the portion of the second IMD layer 302b in the region 390 prior to forming the conductive layer 904 (FIG. 9A) and the first insulating layer 314. The mask 906 may be removed before forming the conductive layer 908 (FIG. 9D), and the conductive layer 908 is also formed on the portion of the second IMD layer 302b in the region 390. The patterning of the conductive layer 908 forms the second conductive layer 316 and the conductive layer 330. In some embodiments, the mask 906 may be formed on the portion of the second IMD layer 302b in the region 390 prior to forming the conductive layer 904 (FIG. 9A), the first insulating layer 314, the second conductive layer 316, and the second insulating layer 318. The mask 906 may be removed before forming the conductive layer (not shown) to be patterned to the third conductive layer 320, and the conductive layer (not shown) is also formed on the portion of the second IMD layer 302b in the region 390. The patterning of the conductive layer forms the third conductive layer 320 and the conductive layer 330.

Figure 9H:
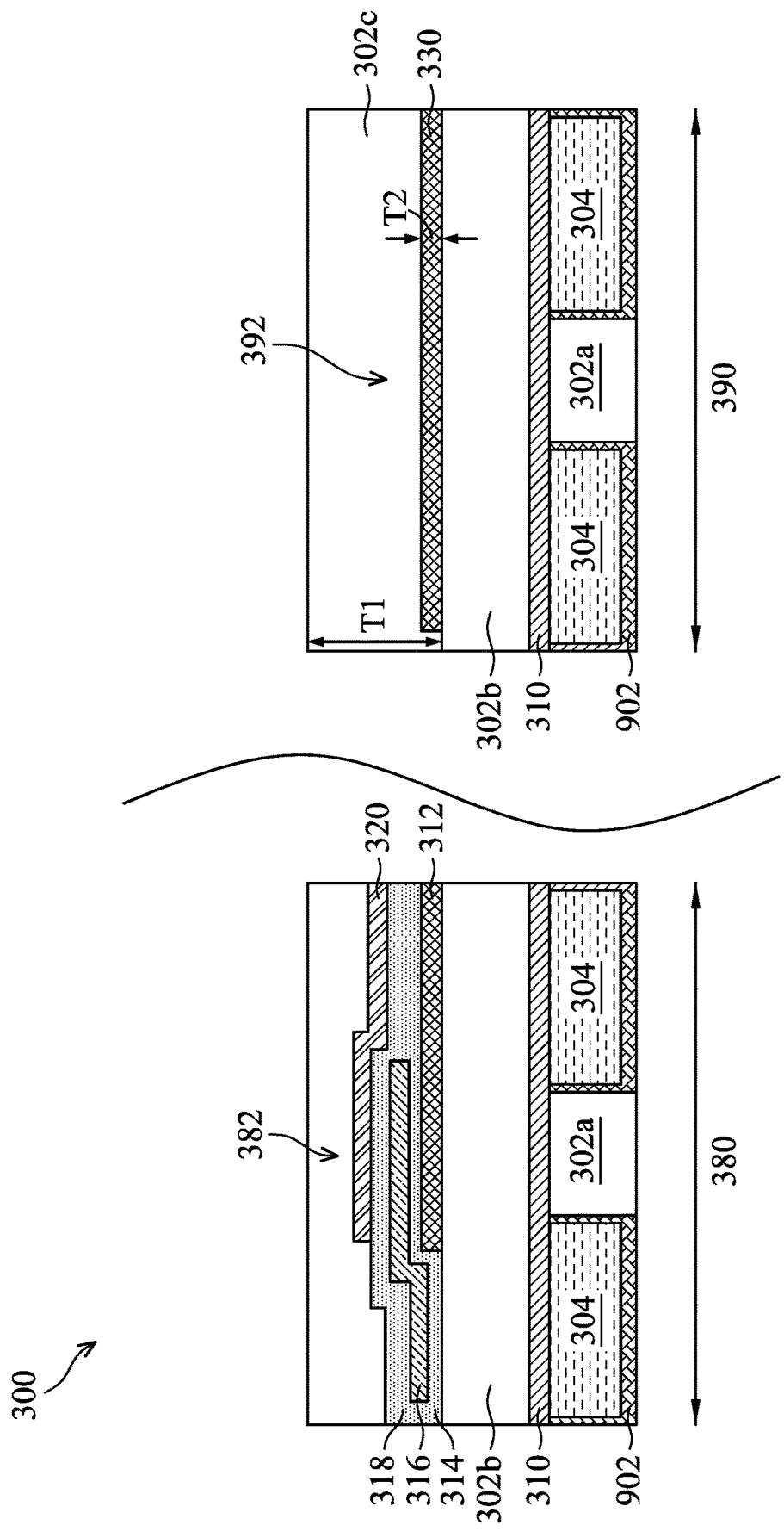

As shown in FIG. 9H, the third IMD layer 302c is formed on the passive component 382, the passive component 392, and portions of the second IMD layer 302b. The third IMD layer 302c may be formed by any suitable process, such as FCVD. In some embodiments, a CMP process may be performed so the top surface of the third IMD layer 302c is planar in regions 380, 390. As shown in FIG. 9H, the third IMD layer 302c has a thickness T1 in the region 390, and the conductive layer 330 has a thickness T2 in the region 390. In some embodiments, the thickness T1 is about 5 times to about 20 times the thickness of T2. If the thickness T1 is less than about 5 times the thickness T2, the portion of the third IMD layer 302c in the region 380 may not be thick enough to cover the passive component 382. On the other hand, if the thickness T2 is greater than about 20 times the thickness T2, manufacturing cost is increased without significant advantage. In some embodiments, the thickness T1 ranges from about 100 nm to about 1000 nm, and the thickness T2 range from about 20 nm to about 100 nm. Both passive components 382, 392 are embedded in the same third IMD layer 302c, and the passive component 392 is formed by the processes of forming the passive component 382. Thus, manufacturing cost is reduced, and manufacturing complexity is decreased. Furthermore, with the capacitor (passive component 382) and resistor (passive component 392) disposed side-by-side in a semiconductor die, the semiconductor die may be used in RF or mix-signal circuit design. For example, in some embodiments, a semiconductor die (or chip) includes the passive components 382, 392, the devices 200 (FIGS. 1A and 1B), inductors (which may be the conductive features 324a, 324b, 324c, 324d), and varactors (which are transistors having n-type source and drain in n-type wells), and the semiconductor die may be used in analog-to-digital converter (ADC), voltage control oscillator (VCO), filter, decoupling capacitor, or other suitable application.

Figure 9I:
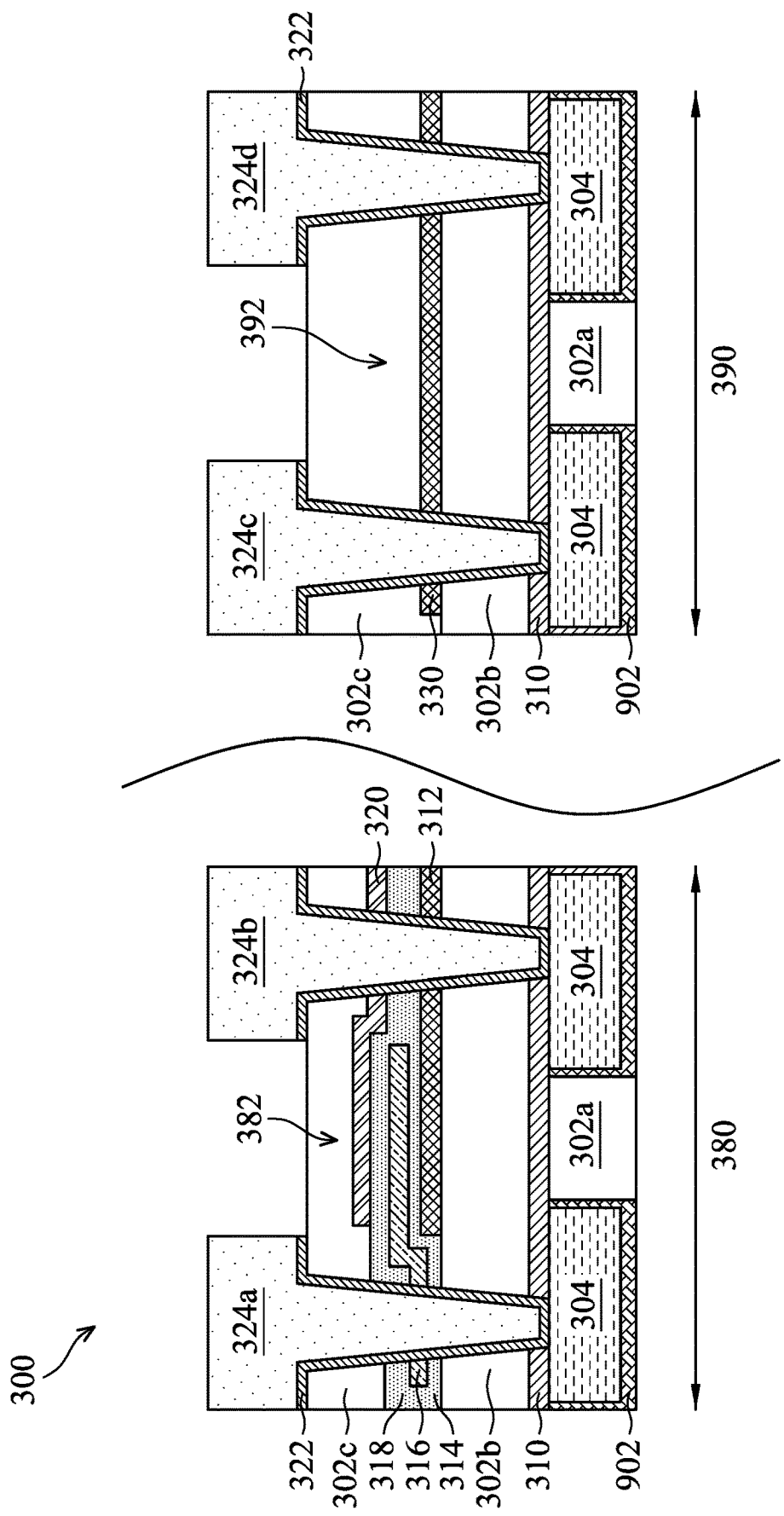

As shown in FIG. 9I, the barrier layers 322 and the conductive features 324a, 324b, 324c, 324d are formed in the third IMD layer 302c, the passive components 382, 392, the second IMD layer 302b, and the etch stop layer 310.

Figure 10A:
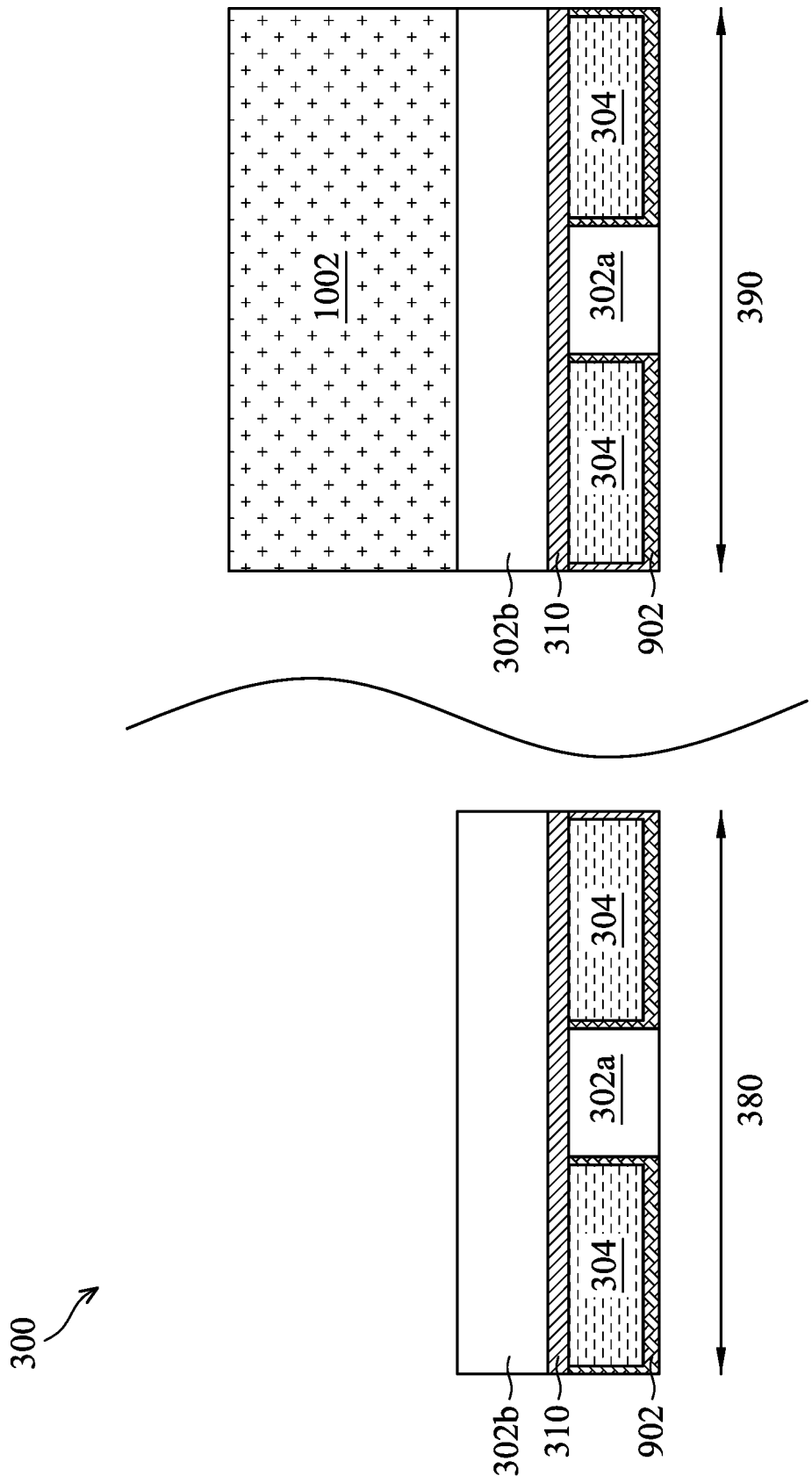
FIG. 10A-10F are cross-sectional side views of various stages of manufacturing the interconnect structure, in accordance with alternative embodiments.

FIG. 10A-10F are cross-sectional side views of various stages of manufacturing the interconnect structure 300, in accordance with alternative embodiments. As shown in FIG. 10A, a mask 1002 is formed on the portion of the second IMD layer 302b in the region 390. The mask 1002 may include the same material as the mask 906 (FIG. 9C) and formed by the same process as the mask 906.

Figure 10B:
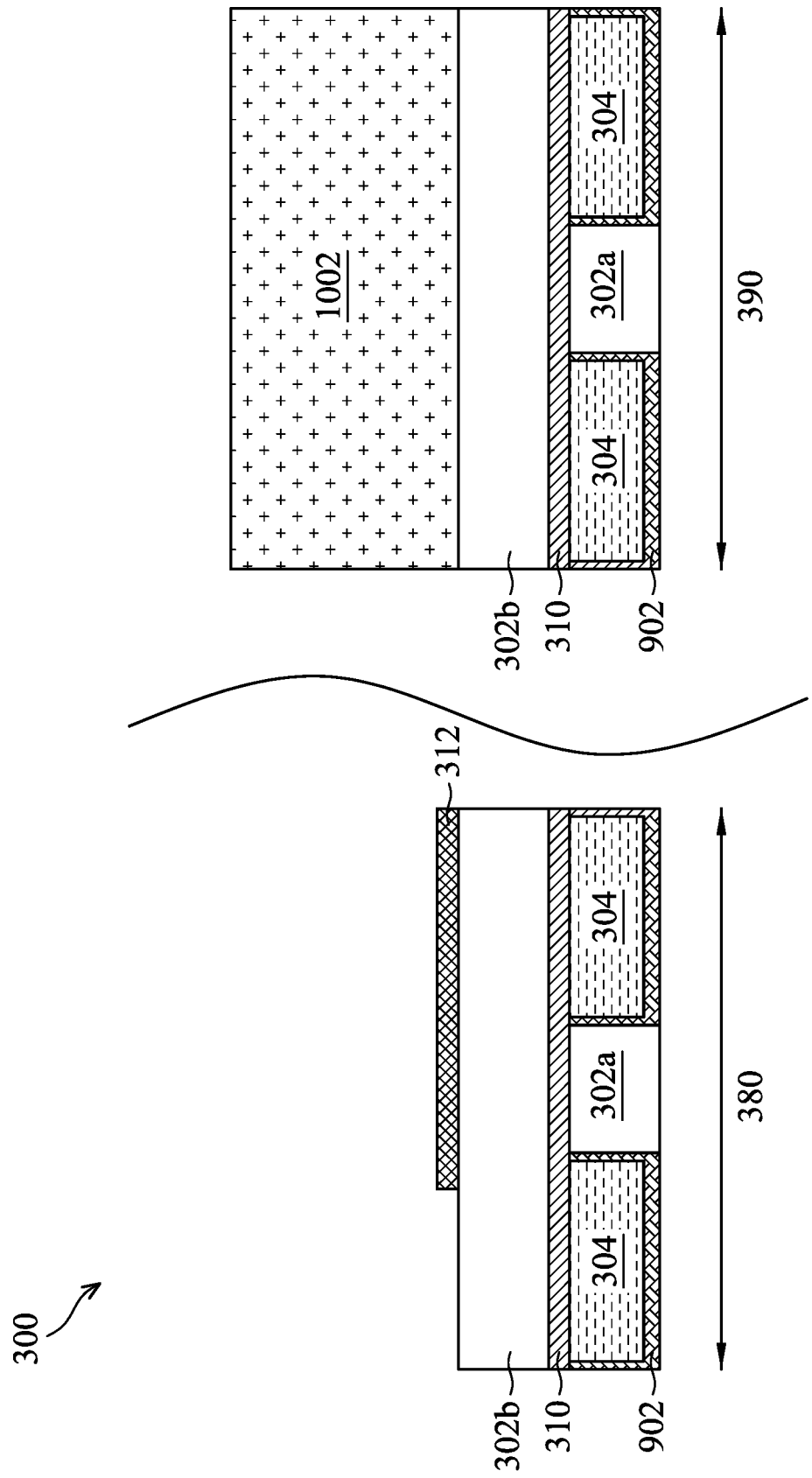
Figure 10C:
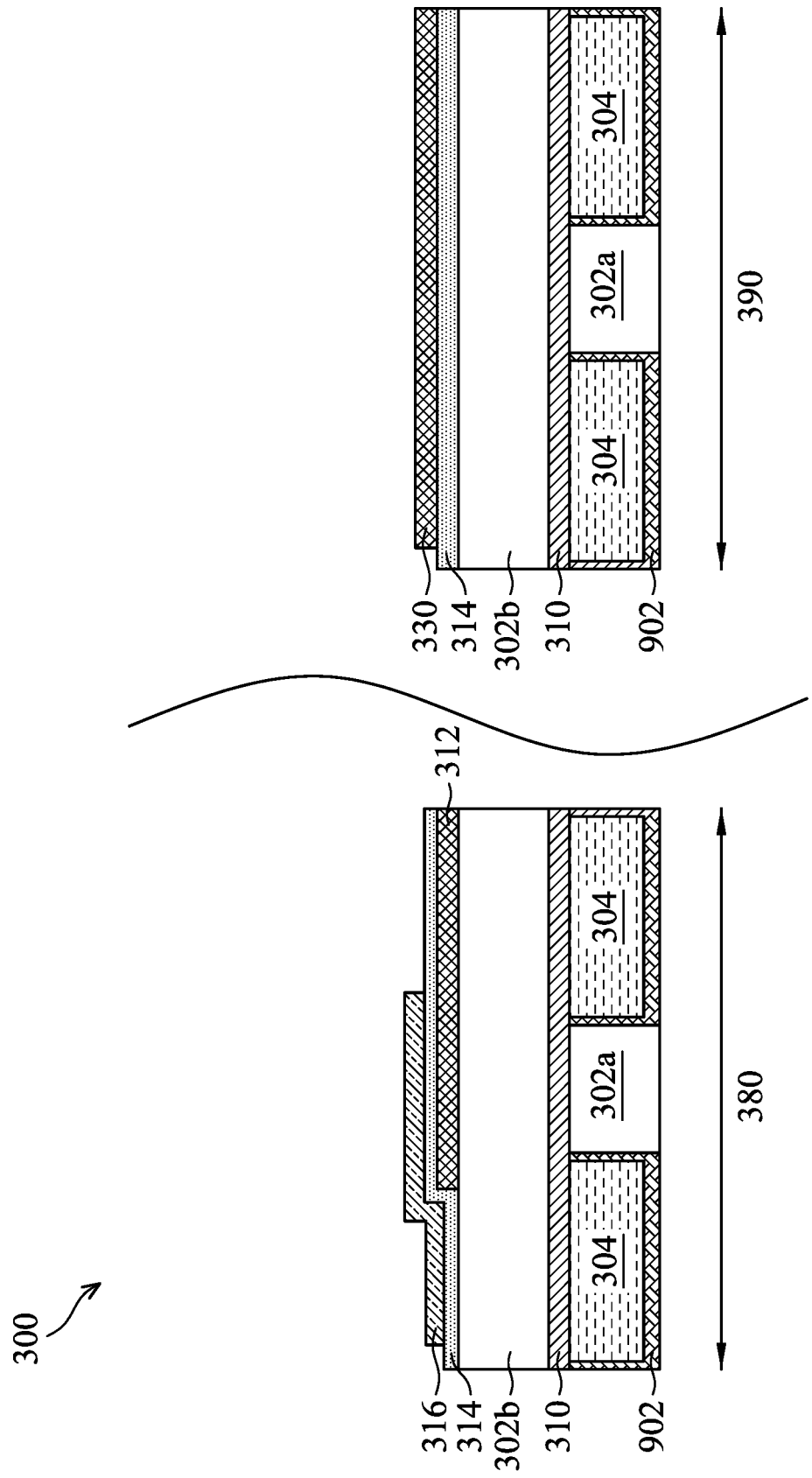

As shown in FIG. 10B, the first conductive layer 312 is formed on the portion of the second IMD layer 302b in the region 380. Next, as shown in FIG. 10C, the mask 1002 is removed, and the first insulating layer 314 is formed in the regions 380, 390. The first insulating layer 314 is formed on a portion of the second IMD layer 302b and on the first conductive layer 312 in the region 380, and the first insulating layer 314 is formed on the portion of the second IMD layer 302b in the region 390. The second conductive layer 316 and the conductive layer 330 are formed on the first insulating layer 314 in the regions 380, 390, respectively. The second conductive layer 316 and the conductive layer 330 may be formed by first forming a blanket conductive layer on the first insulating layer 314 and then patterning the blanket conductive layer.

Figure 10D:
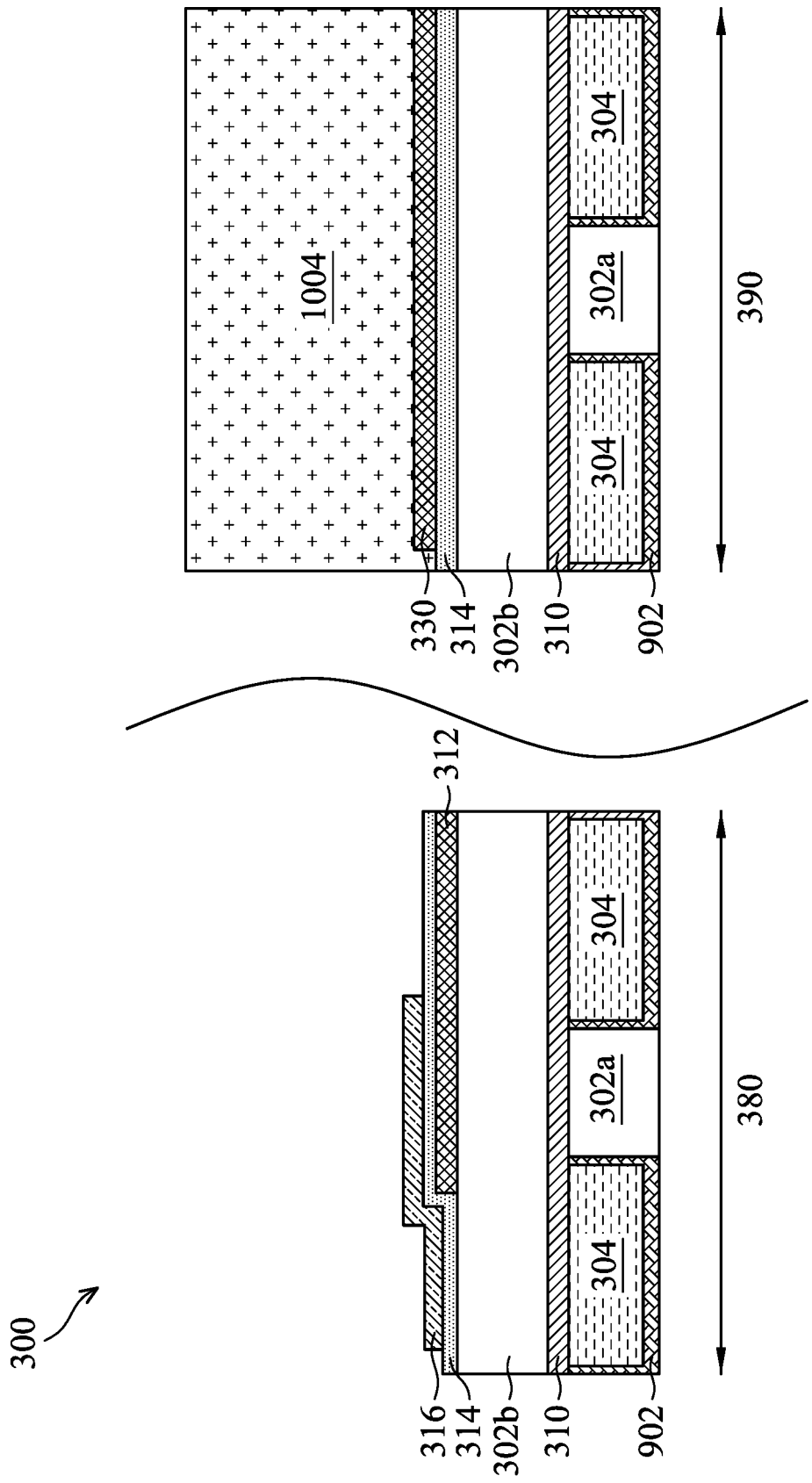
Figure 10E:
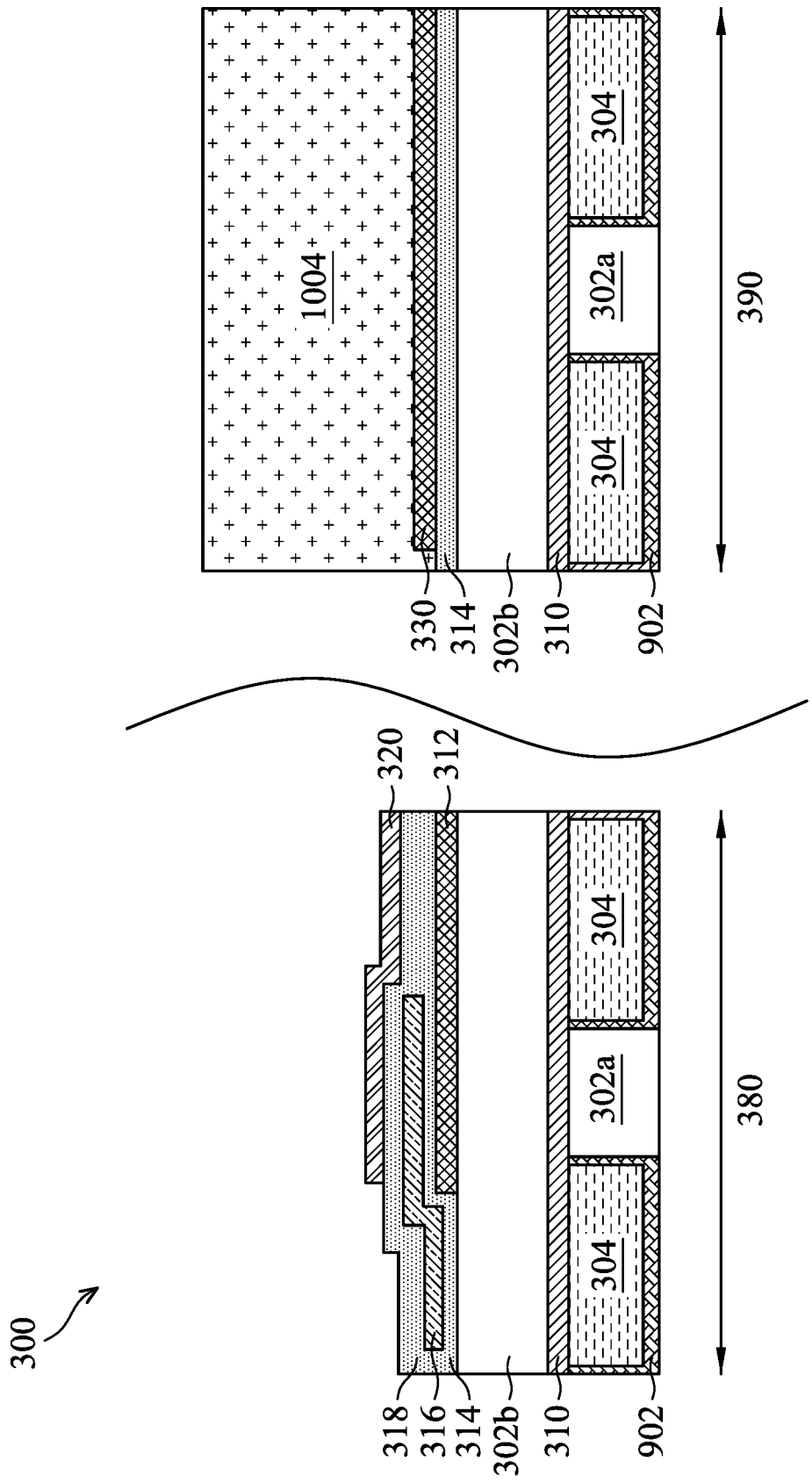

As shown in FIG. 10D, a mask 1004 is formed on the conductive layer 330 and a portion of the first insulating layer 314 in the region 390. The mask 1004 may include the same material as the mask 1002 and may be formed by the same process as the mask 1002. Next, as shown in FIG. 10E, the second insulating layer 318 and the third conductive layer 320 are formed in the region 380. In some embodiments, the mask 1004 is formed after the second insulating layer 318 is formed. Thus, in some embodiments, the conductive layer 330 is disposed between the first and second insulating layers 314, 318 in the region 390. By having the second insulating layer 318 disposed on the conductive layer 330, the conductive layer 330 is protected from the etchant in the removal of the mask 1004.

Figure 10F:
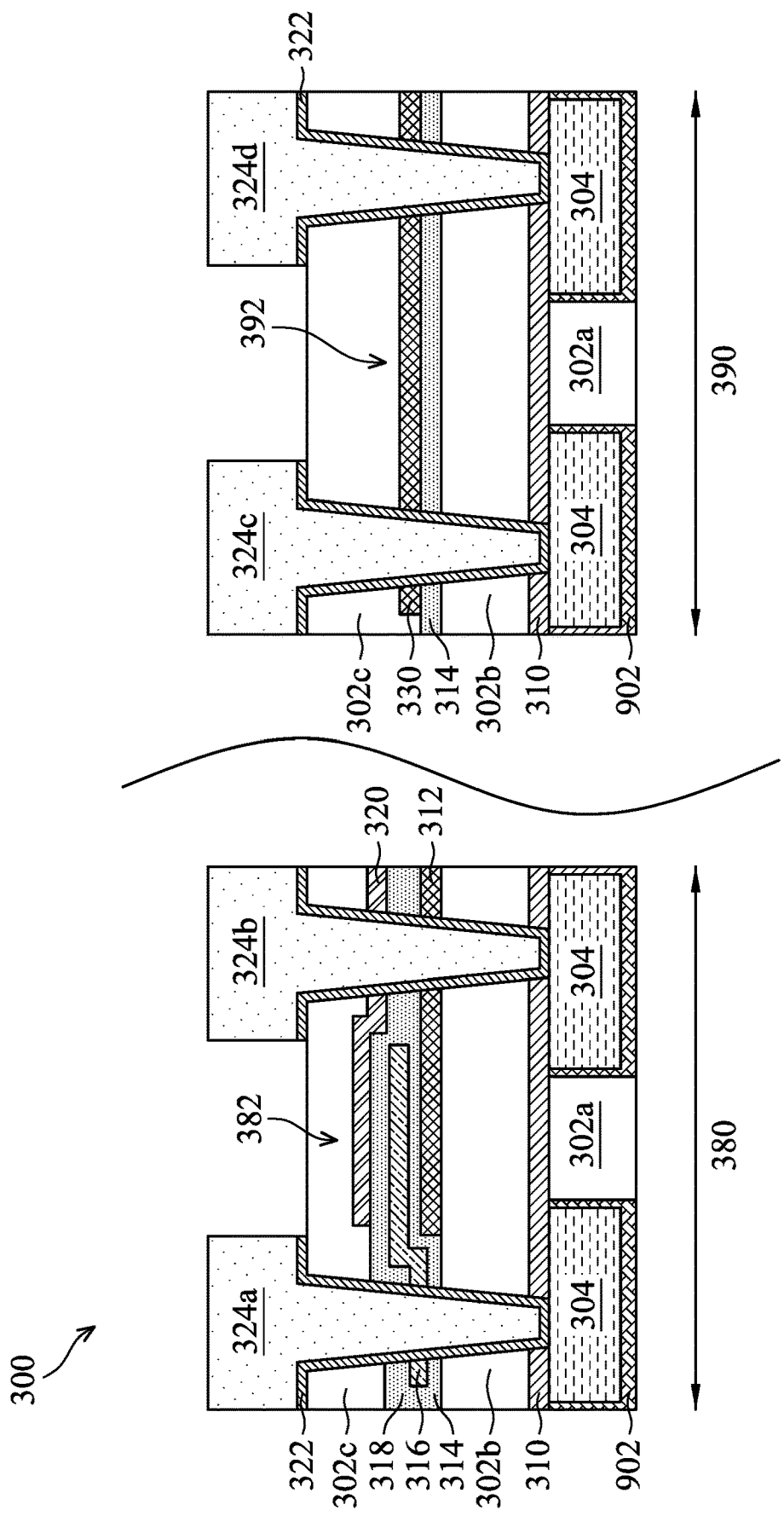

As shown in FIG. 10F, the mask 1004 is removed, the third IMD layer 302c is formed on the passive components 382, 392, and the barrier layers 322 and the conductive features 324a, 324b, 324c, 324d are formed in the in the third IMD layer 302c, the passive components 382, 392, the second IMD layer 302b, and the etch stop layer 310. The masks 1002, 1004 may be formed and removed at different times to form the interconnect structure 300 shown in FIGS. 6, 7, and 8.

The present disclosure in various embodiments provides an interconnect structure and methods of forming the same. In some embodiments, the interconnect structure includes two different passive components, such as the passive components 382, 392, disposed in the same IMD layer, such as the third IMD layer 302c. The passive components 382, 392 are formed by the same processes. Some embodiments may achieve advantages. For example, because the passive components 382, 392 are formed by the same processes, manufacturing cost is reduced, and manufacturing complexity is decreased.

An embodiment is an interconnect structure. The structure includes a first intermetal dielectric (IMD) layer disposed over a plurality of conductive features and a first passive component disposed on the first IMD layer in a first region of the substrate. The first passive component is a capacitor. The structure further includes a second passive component disposed on the first IMD layer in a second region of the substrate. The second passive component is a resistor including a first conductive layer, and the first conductive layer has a first thickness. The structure further includes a second IMD layer disposed on the first passive component in the first region and on the second passive component and a portion of the first IMD layer in the second region. A top surface of the second IMD layer in the first and second regions is substantially planar, and the second IMD layer has a second thickness ranging from about five times to about 20 times the first thickness.

Another embodiment is an interconnect structure. The structure includes a first intermetal dielectric (IMD) layer disposed over a plurality of conductive features and a first passive component disposed on the first IMD layer in a first region of the substrate. The first passive component includes a first conductive layer, a first insulating layer disposed on the first conductive layer, a second conductive layer disposed on the first insulating layer, a second insulating layer disposed on the second conductive layer, and a third conductive layer disposed on the second insulating layer. The structure further includes a second passive component disposed over the first IMD layer in a second region of the substrate. The second passive component includes a fourth conductive layer disposed over the first IMD layer in the second region, and an insulating layer is disposed on the fourth conductive layer in the second region. The structure further includes a second IMD layer disposed on the third conductive layer in the first region and on the insulating layer in the second region.

A further embodiment is a method. The method includes forming a first intermetal dielectric (IMD) layer over a plurality of conductive features and forming a first passive component over the first IMD layer. The forming the first passive component over the first IMD layer includes forming a first conductive layer over the first IMD layer, forming a first insulating layer on the first conductive layer, forming a second conductive layer on the first insulating layer, forming a second insulating layer on the second conductive layer, and forming a third conductive layer on the second insulating layer. The method further includes forming a second passive component over the first IMD layer. The forming the second passive component over the first IMD layer includes forming a fourth conductive layer over the first IMD layer, and the fourth conductive layer is formed at the same time as the first, second, or third conductive layer. The method further includes forming a second IMD layer on the first and second passive components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a first intermetal dielectric (IMD) layer over a plurality of conductive features;
   forming a first passive component over the first IMD layer, comprising:
      forming a first conductive layer over the first IMD layer;
      forming a first insulating layer on the first conductive layer;
      forming a second conductive layer on the first insulating layer;
      forming a second insulating layer on the second conductive layer; and
      forming a third conductive layer on the second insulating layer;
   forming a second passive component over the first IMD layer, comprising:
      forming a fourth conductive layer over the first IMD layer, wherein the fourth conductive layer is formed at the same time as the first, second, or third conductive layer; and
      forming a second IMD layer on the first and second passive components.

2. The method of claim 1, further comprising forming a mask on the fourth conductive layer prior to forming the first insulating layer.

3. The method of claim 1, wherein the first insulating layer is formed on both the first conductive layer and the fourth conductive layer.

4. The method of claim 1, wherein the fourth conductive layer is formed at the same time as the first conductive layer.

5. The method of claim 4, wherein forming the first and fourth conductive layers comprise depositing a conductive layer and patterning the conductive layer.

6. The method of claim 1, further comprising forming first and second conductive features through the fourth conductive layer.

7. The method of claim 6, further comprising forming a third conductive feature through the first and third conductive layers.

8. The method of claim 7, further comprising forming a fourth conductive feature through the second conductive layer.

9. The method of claim 1, further comprising:
   depositing a mask on the fourth conductive layer, wherein the mask covers a side surface of the fourth conductive layer.

10. The method of claim 9, wherein the second IMD layer covers a side surface of the third conductive layer and a side surface of the fourth conductive layer.

11. The method of claim 9, wherein the fourth conductive layer has a first thickness, and the second IMD layer has a second thickness that is about five times to about twenty times the first thickness.

12. The method of claim 9, further comprising forming a first conductive feature through the first insulating layer, the second insulating layer, and the second conductive layer.

13. The method of claim 12, further comprising forming a second conductive feature through the first insulating layer, the second insulating layer, the first conductive layer, and the third conductive layer.

14. The method of claim 13, further comprising forming third and fourth conductive features through the fourth conductive layer.

15. The method of claim 1, wherein the fourth conductive layer is formed at the same time as the second conductive layer.

16. The method of claim 15, wherein forming the second and fourth conductive layers comprise depositing a conductive layer and patterning the conductive layer.

17. The method of claim 1, wherein the fourth conductive layer is formed at the same time as the third conductive layer.

18. The method of claim 17, wherein forming the third and fourth conductive layers comprise depositing a conductive layer and patterning the conductive layer.

19. A method, comprising:
   forming a first intermetal dielectric (IMD) layer over a plurality of conductive features;
   forming a first passive component over the first IMD layer, comprising:
      forming a first conductive layer over the first IMD layer;
      forming a first insulating layer on the first conductive layer;
      forming a second conductive layer on the first insulating layer;
      forming a second insulating layer on the second conductive layer; and
      forming a third conductive layer on the second insulating layer;
   forming a second passive component over the first IMD layer, comprising:
      forming a fourth conductive layer over the first IMD layer, wherein the fourth conductive layer is formed at the same time as the first, second, or third conductive layer; and
      forming a second IMD layer on the first and second passive components, wherein the second IMD layer covers a side surface of the third conductive layer and a side surface of the fourth conductive layer.

20. A method, comprising:
   forming a first intermetal dielectric (IMD) layer over a plurality of conductive features;
   forming a first passive component over the first IMD layer, comprising:
      forming a first conductive layer over the first IMD layer;
      forming a first insulating layer on the first conductive layer;
      forming a second conductive layer on the first insulating layer;
      forming a second insulating layer on the second conductive layer; and
      forming a third conductive layer on the second insulating layer;
   forming a second passive component over the first IMD layer, comprising:
      forming a fourth conductive layer over the first IMD layer, wherein the fourth conductive layer is formed at the same time as the first, second, or third conductive layer; and
      forming a second IMD layer on the first and second passive components, wherein the second IMD layer is deposited on the second insulating layer.

* * * * *